(12) United States Patent
Nishiyama

(10) Patent No.: US 8,883,530 B2
(45) Date of Patent: Nov. 11, 2014

(54) DEVICE MANUFACTURING METHOD AND ORGANIC EL DEVICE

(75) Inventor: Seiji Nishiyama, Osaka (JP)

(73) Assignee: Panasonic Corporation, Osaka (JP)

( * ) Notice: Subject to any disclaimer, the term of this patent is extended or adjusted under 35 U.S.C. 154(b) by 47 days.

(21) Appl. No.: 13/491,020

(22) Filed: Jun. 7, 2012

(65) Prior Publication Data
US 2013/0153936 A1    Jun. 20, 2013

Related U.S. Application Data

(63) Continuation of application No. PCT/JP2011/007026, filed on Dec. 15, 2011.

(51) Int. Cl.
*H01L 33/08* (2010.01)
*H01L 33/62* (2010.01)

(52) U.S. Cl.
USPC .. 438/34; 257/88; 257/E33.061; 257/E33.066

(58) Field of Classification Search
USPC ........... 257/79–103, 57, 59, 66, 72, 359, 390, 257/443, E21.411, E21.412, E51.005, 257/E29.151, E27.1, E29.117
See application file for complete search history.

(56) References Cited

U.S. PATENT DOCUMENTS

| | | | |
|---|---|---|---|
| 5,443,922 A | 8/1995 | Nishizaki et al. | |
| 6,356,320 B1 * | 3/2002 | Chung et al. | 349/54 |
| 6,356,321 B1 * | 3/2002 | Ogawa | 349/58 |
| 2004/0229410 A1 | 11/2004 | Takizawa | |
| 2007/0087616 A1 * | 4/2007 | Sakakura et al. | 439/395 |

FOREIGN PATENT DOCUMENTS

| | | |
|---|---|---|
| JP | 05-163488 | 6/1993 |
| JP | 2004-226898 A | 8/2004 |
| JP | 2005-203345 A | 7/2005 |
| JP | 2006-040589 A | 2/2006 |
| JP | 2006-221025 A | 8/2006 |
| JP | 2006-351263 A | 12/2006 |
| JP | 4-604752 | 10/2010 |

OTHER PUBLICATIONS

International Search Report, dated Dec. 15, 2011.

* cited by examiner

*Primary Examiner* — Fernando L Toledo
*Assistant Examiner* — Lawrence-Linh T Nguyen
(74) *Attorney, Agent, or Firm* — Greenblum & Bernstein, P.L.C.

(57) ABSTRACT

A device manufacturing method including substrate preparation, pixel electrode formation, photosensitive film formation, first part exposure, second part exposure, and development. In first part exposure, after execution of photosensitive film formation, first photomask is arranged to face substrate and exposure is performed to cause first part of photosensitive film to be exposed to light via first photomask. In second part exposure, after or together with execution of first part exposure, second photomask is arranged to face substrate and exposure is performed to cause second part of photosensitive film, which is different from first part at least partially, to be exposed to light via second photomask. In second part exposure, second photomask is arranged such that end thereof overlaps with end of first photomask, and overlap between first and second photomasks positionally corresponds to electrical wire.

17 Claims, 32 Drawing Sheets

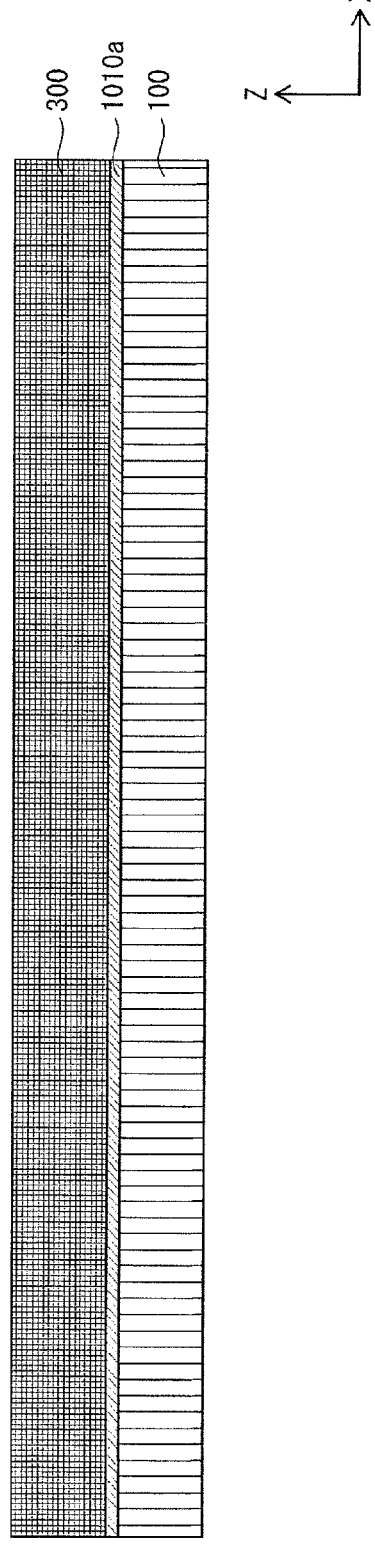

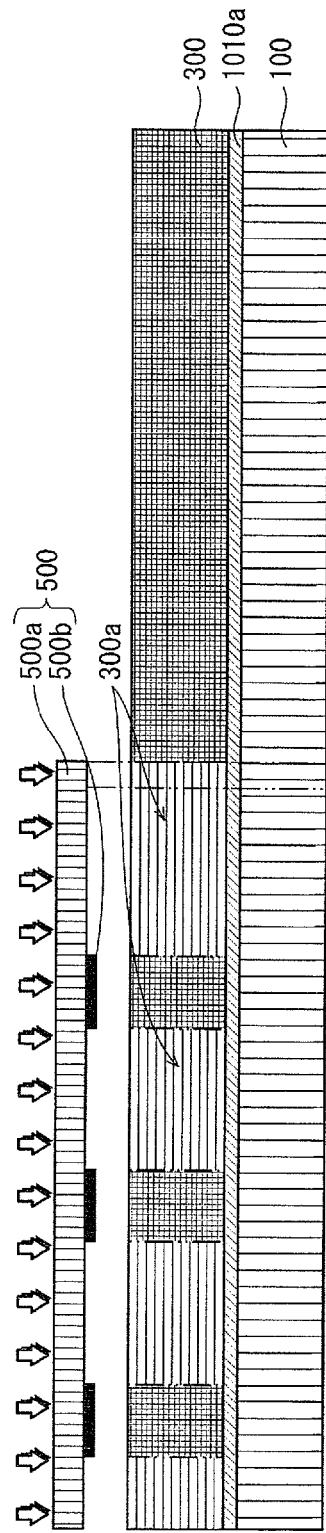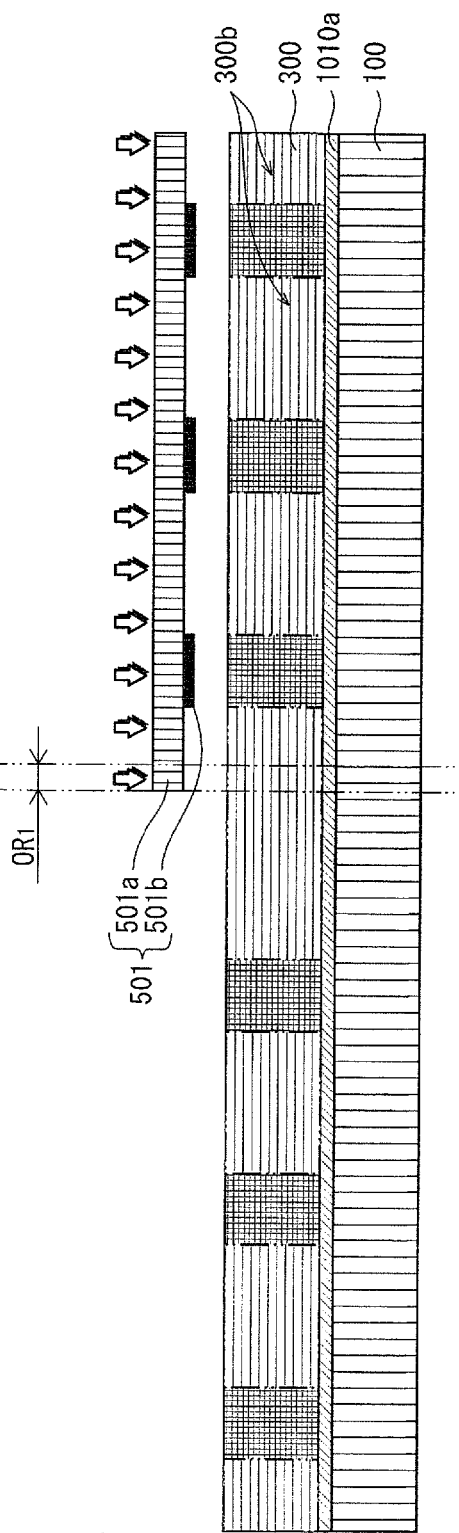

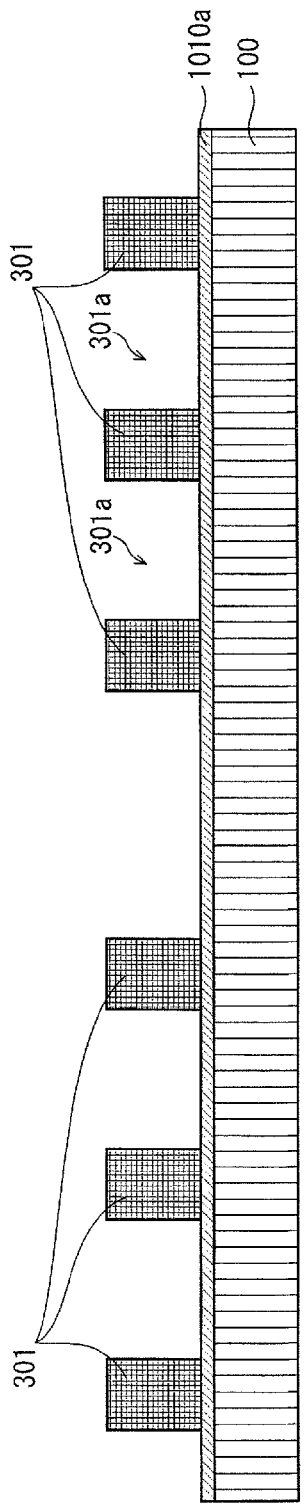
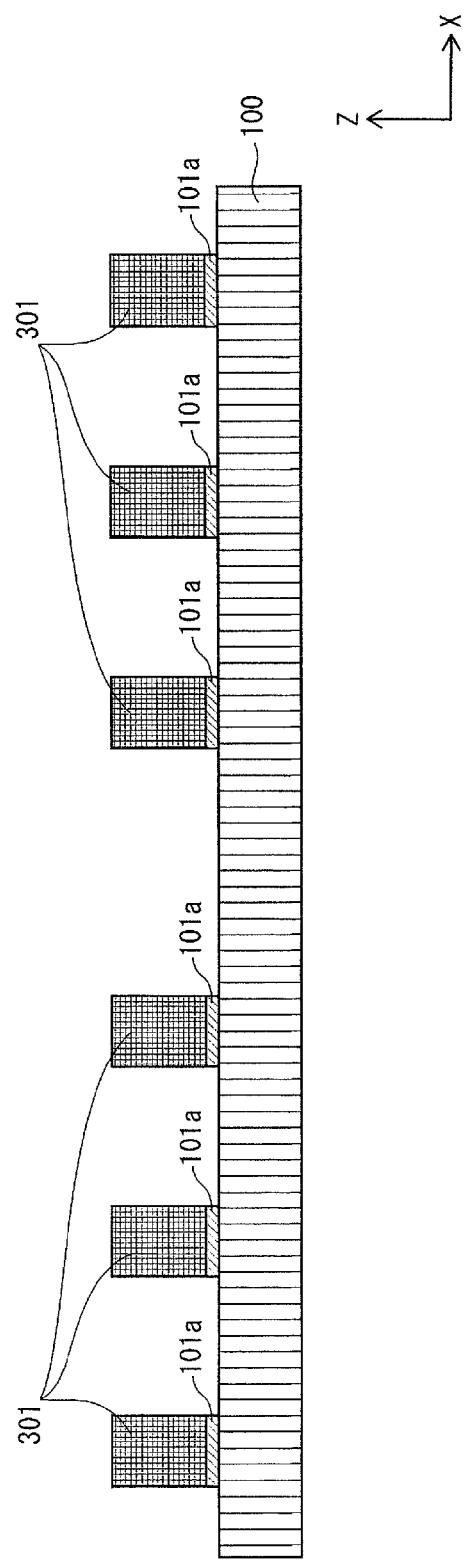

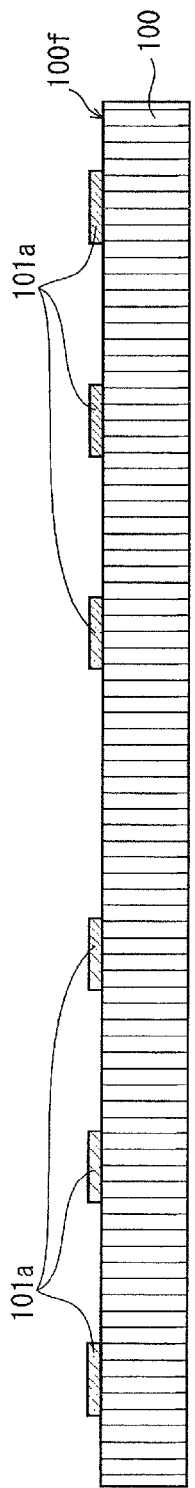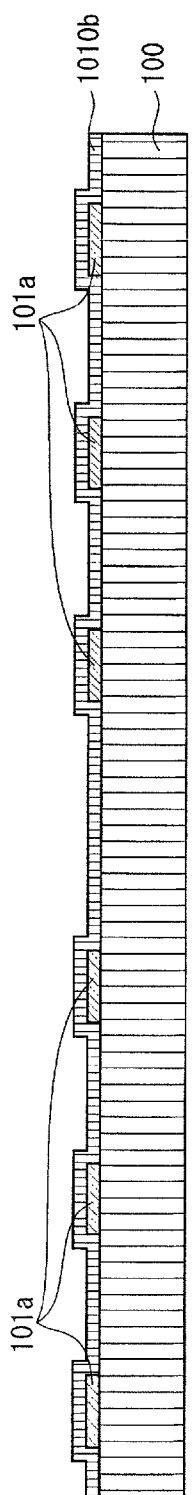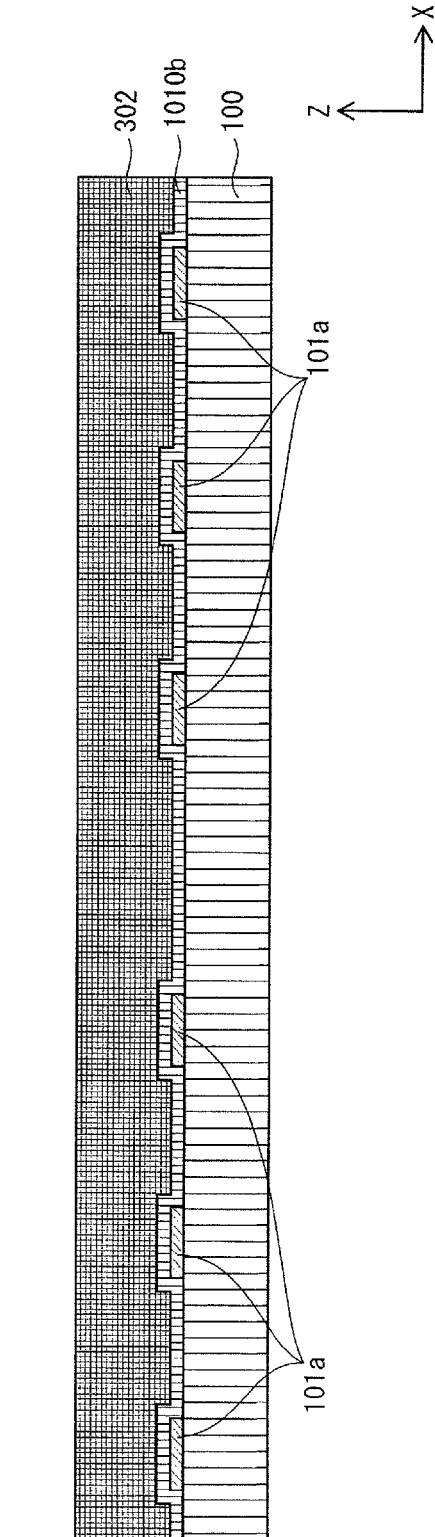

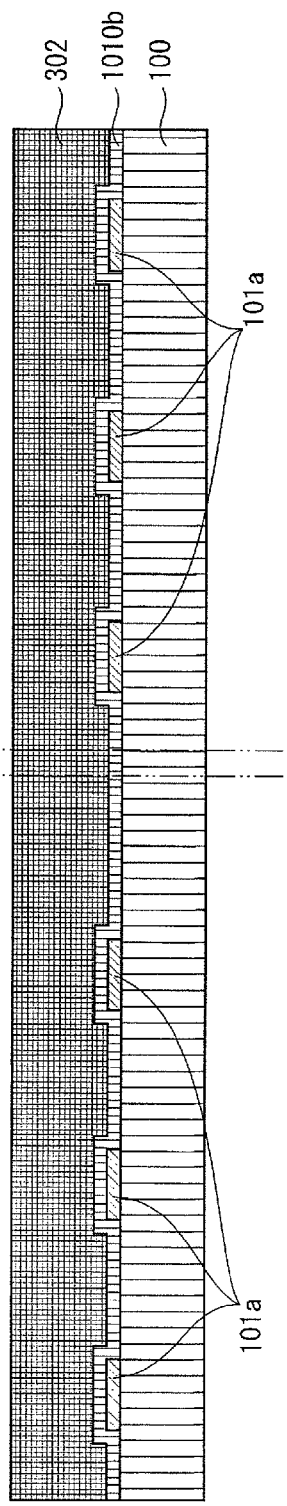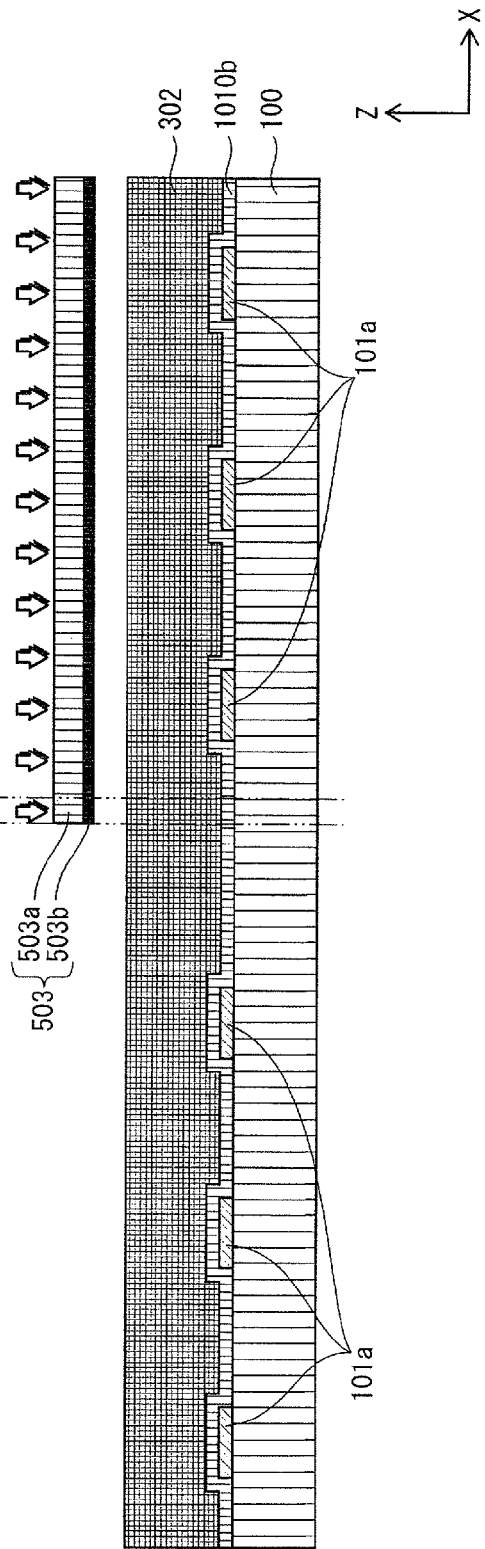
FIG. 6A
FIG. 6B

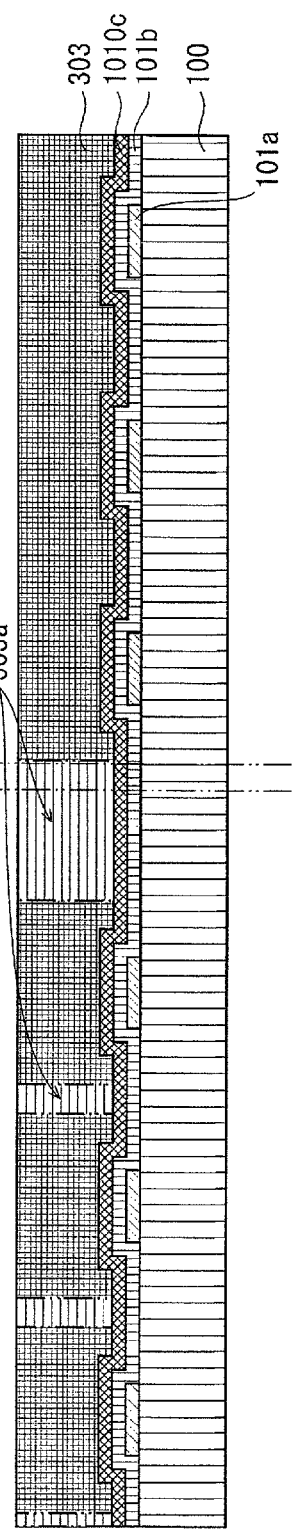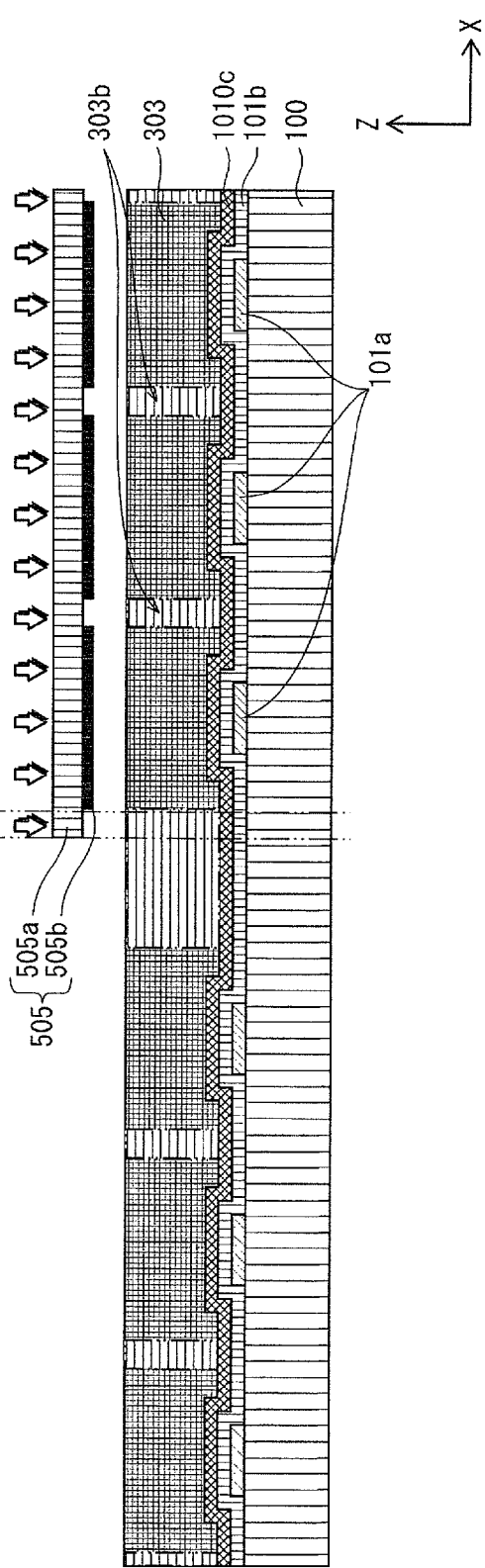

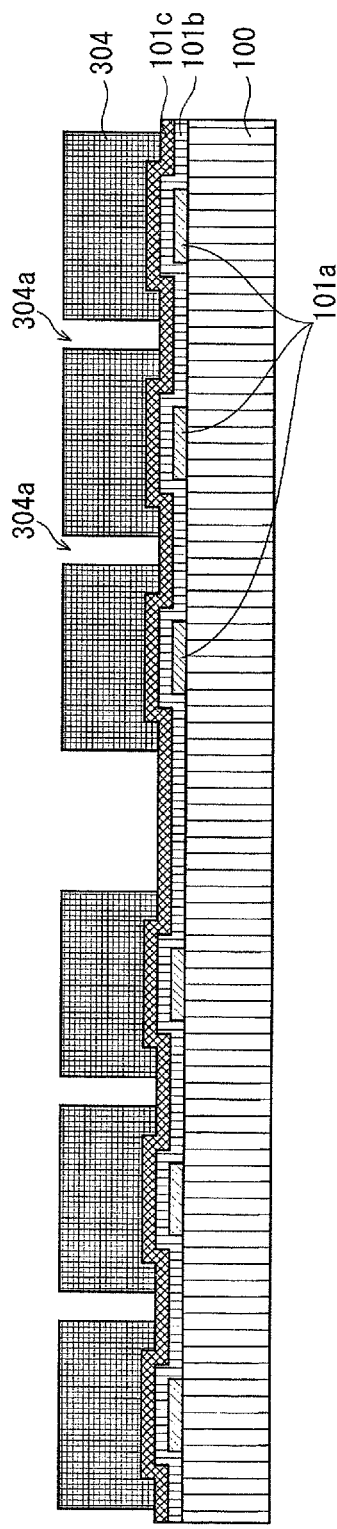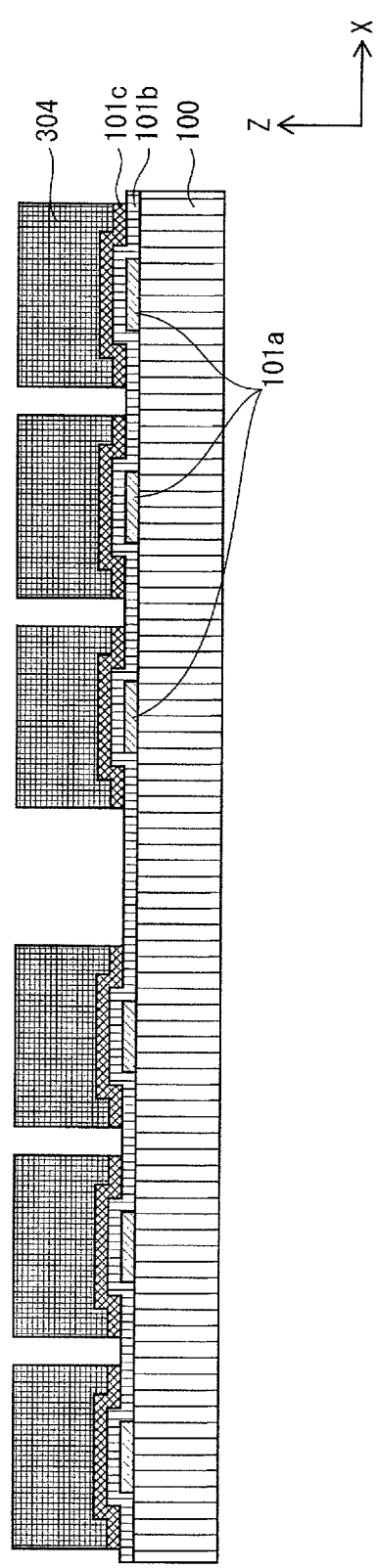

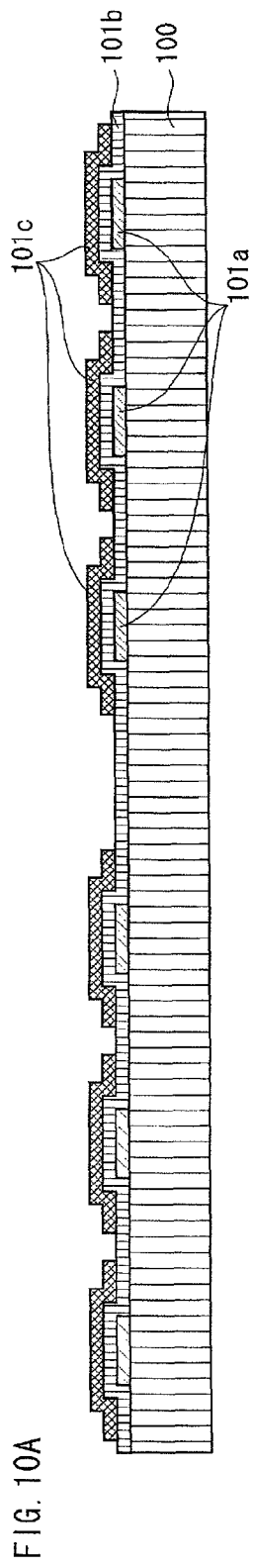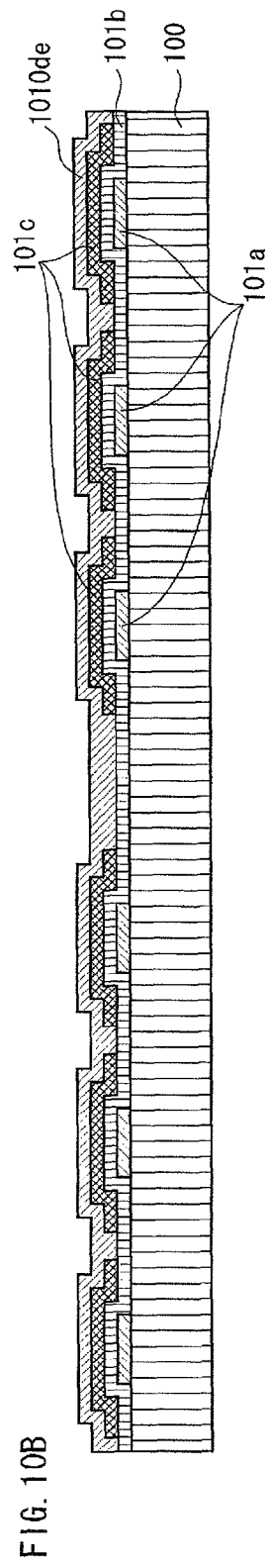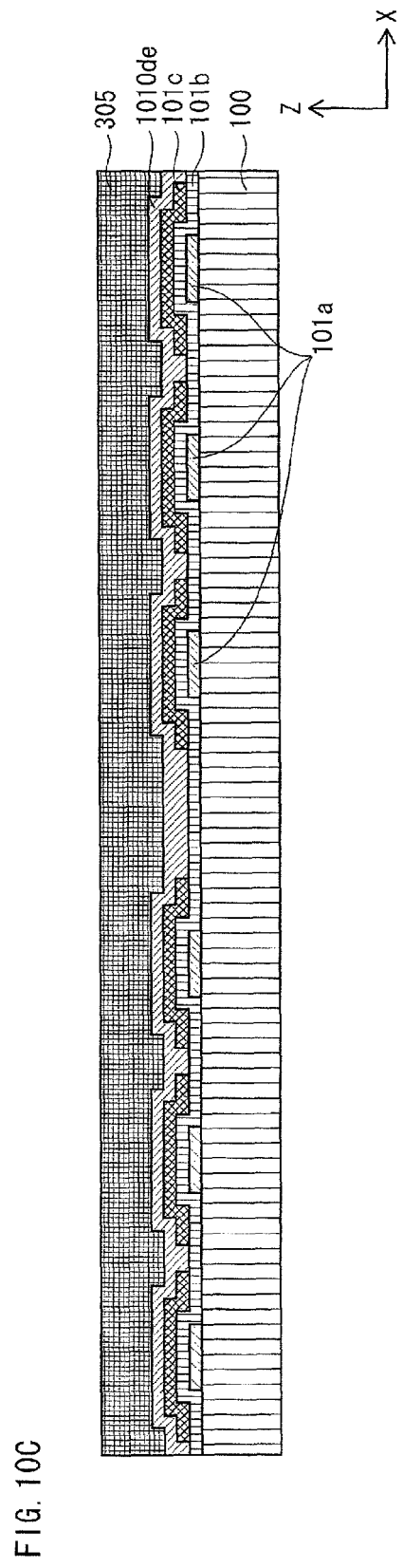

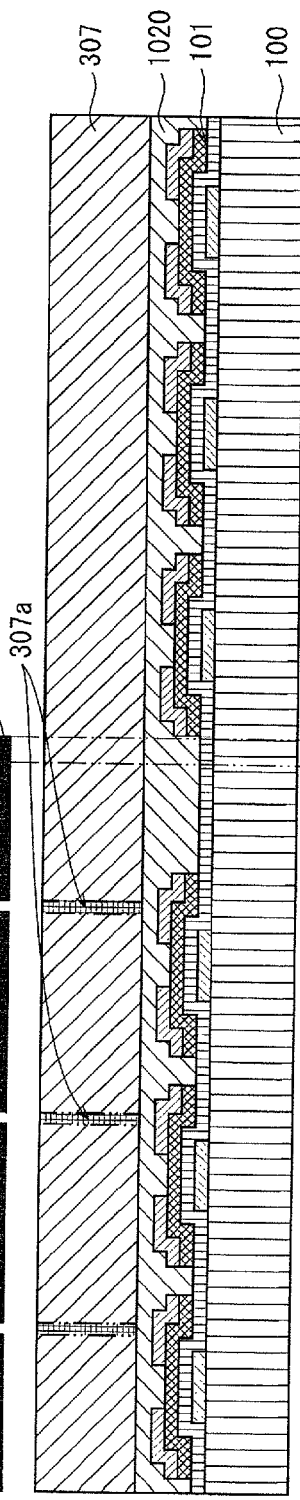
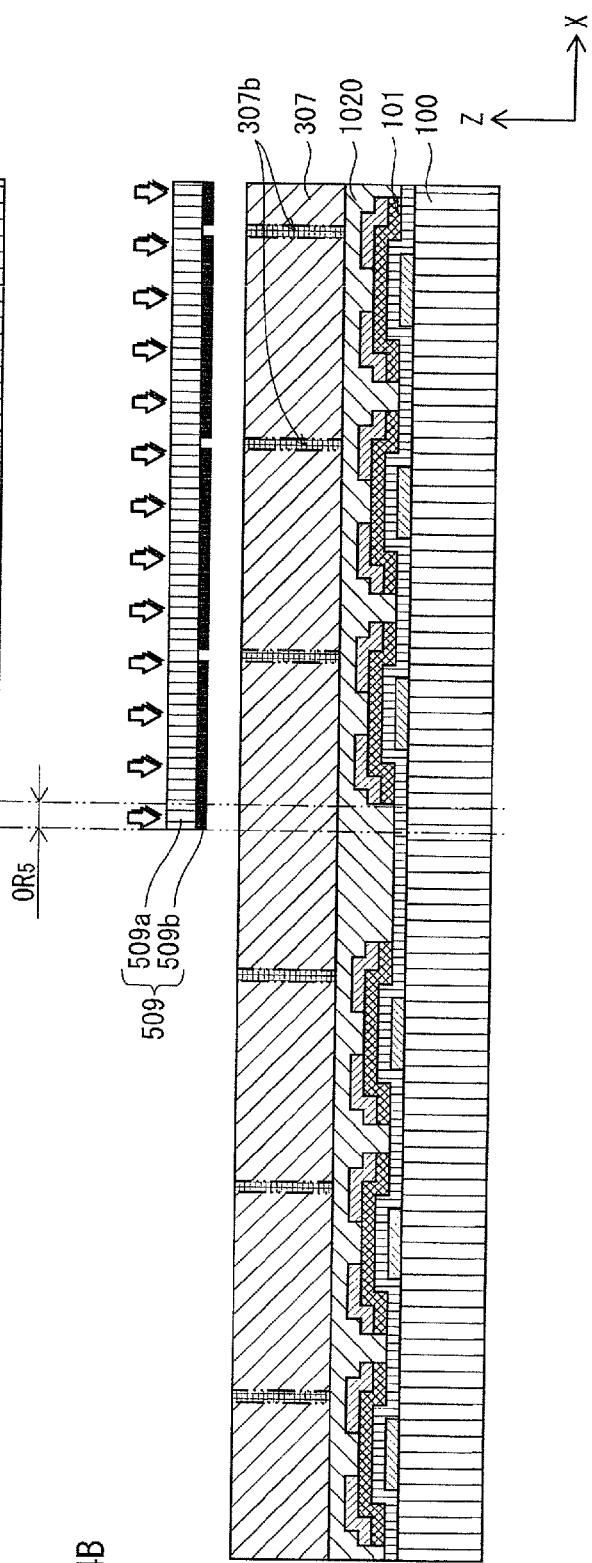
FIG. 14A
FIG. 14B

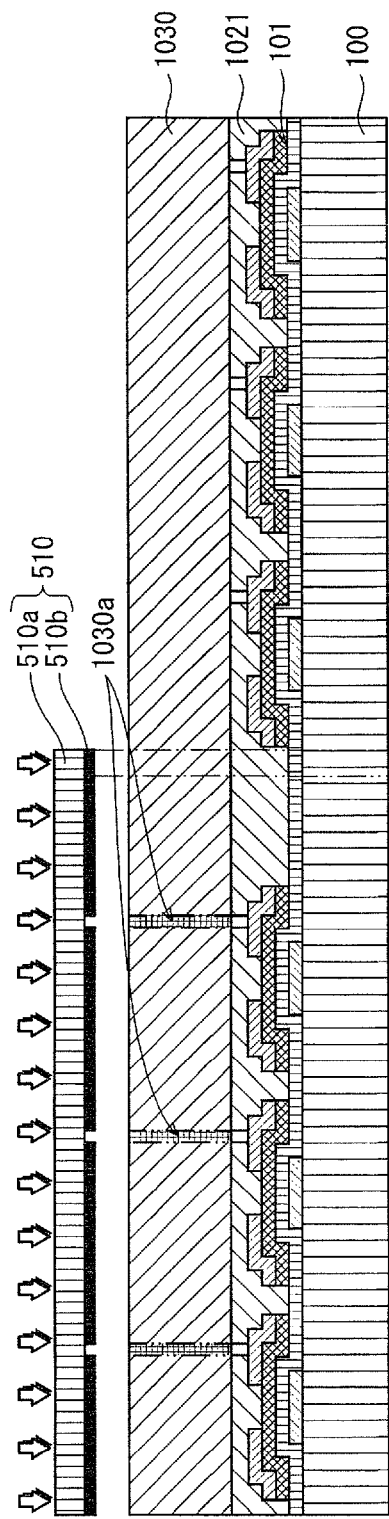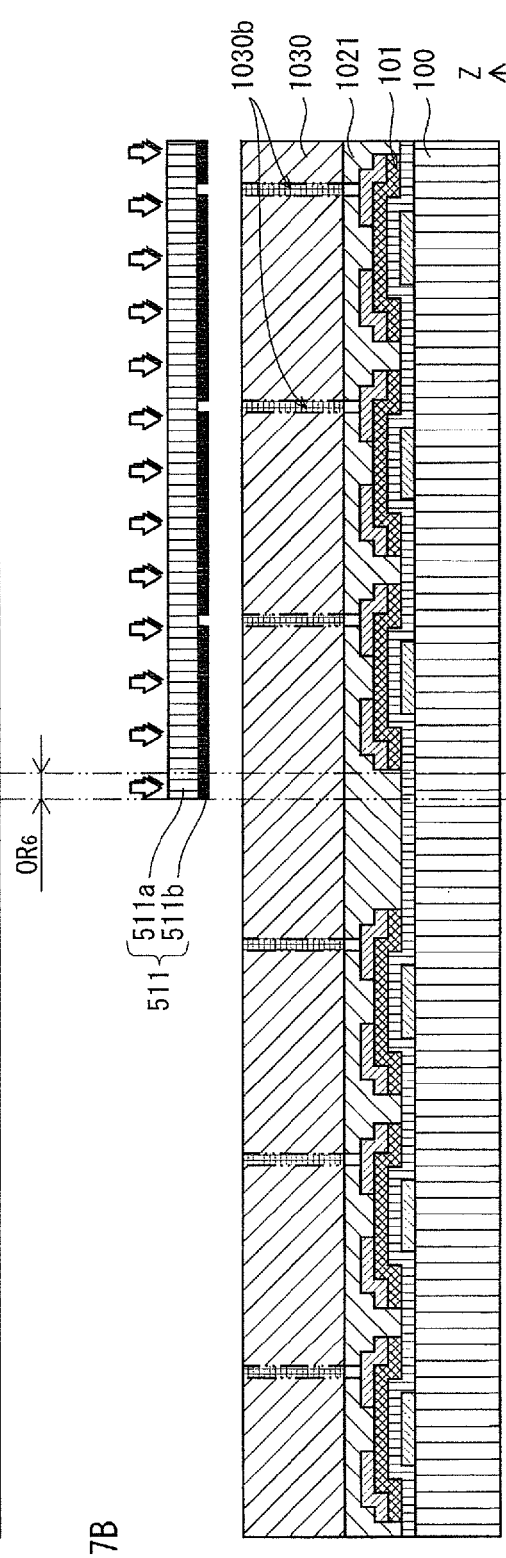

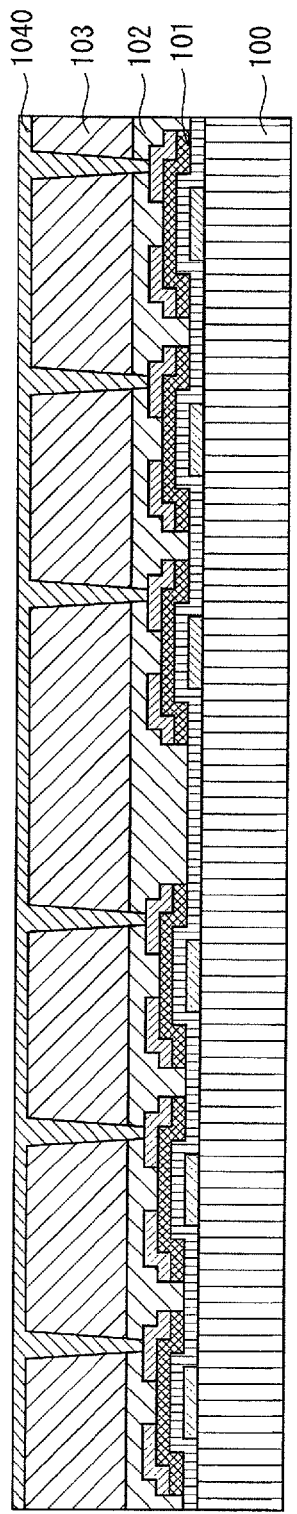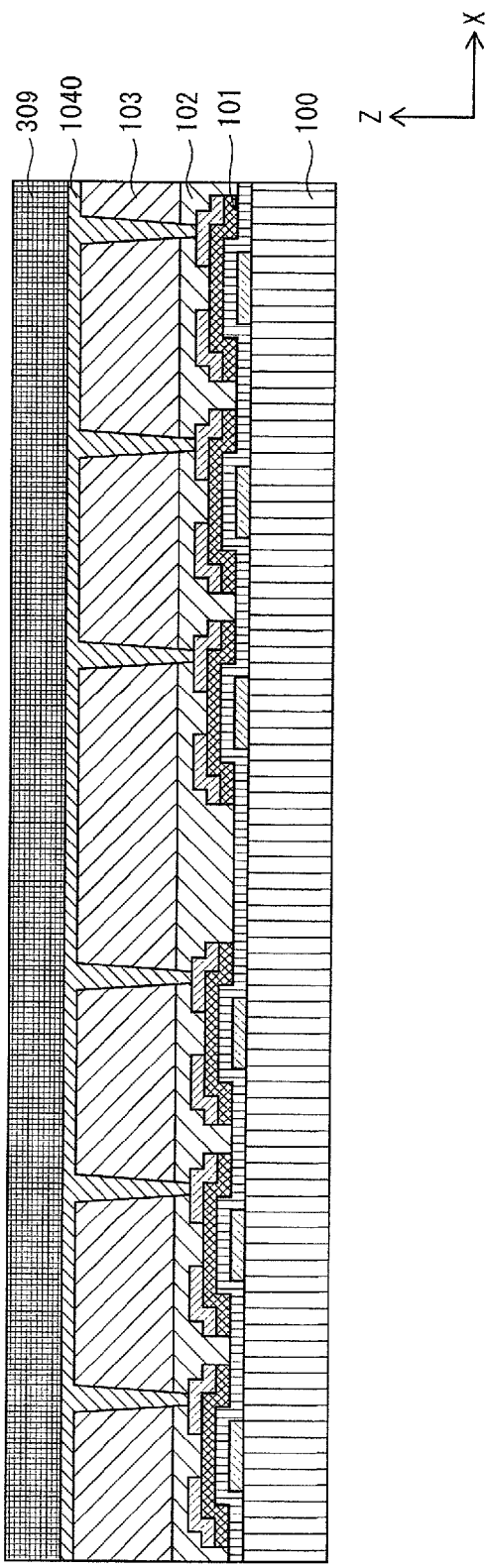
FIG. 19A
FIG. 19B

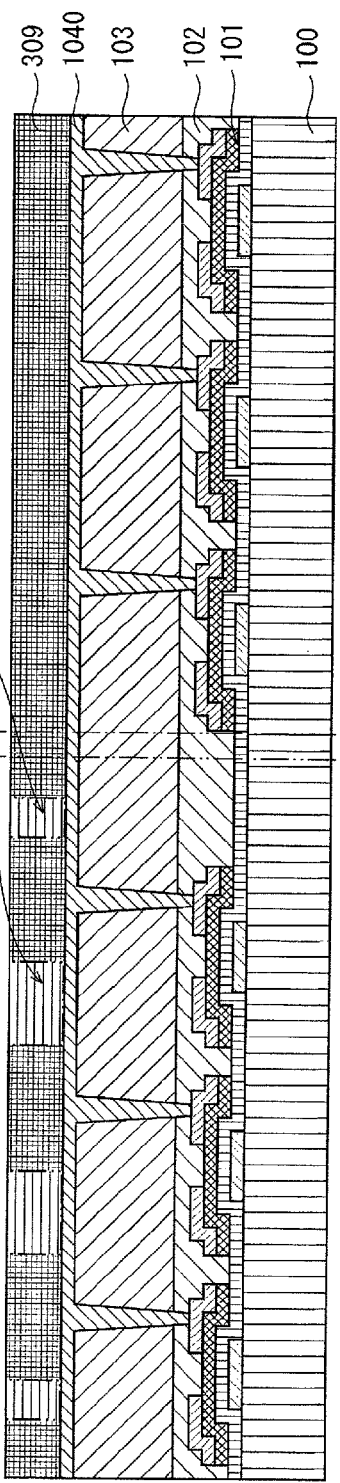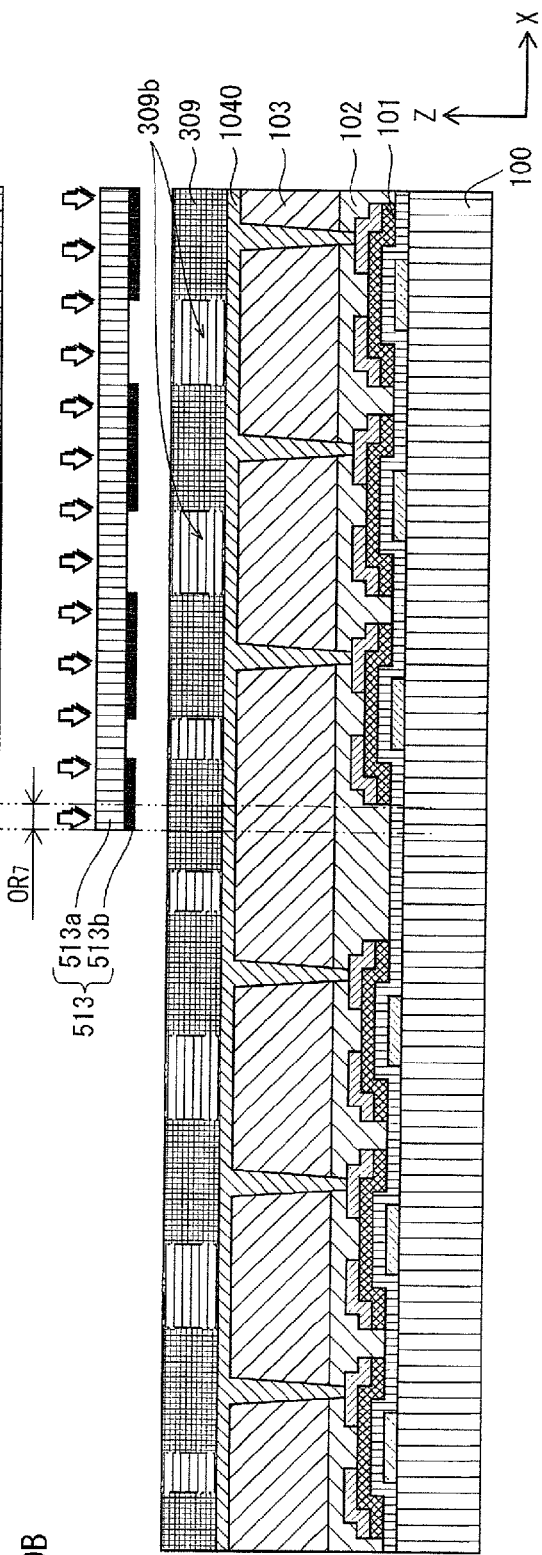
FIG. 20A
FIG. 20B

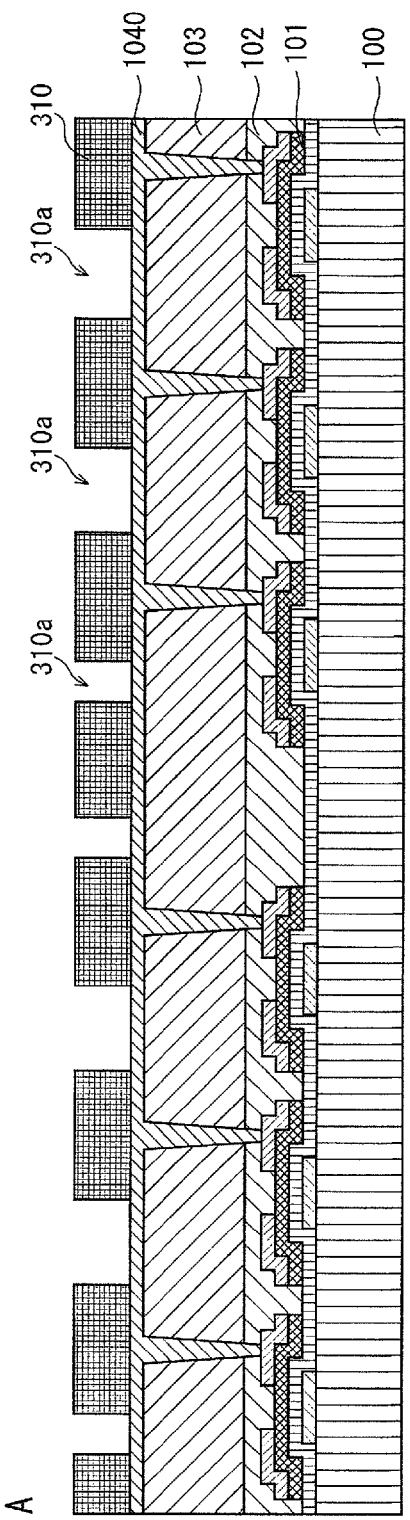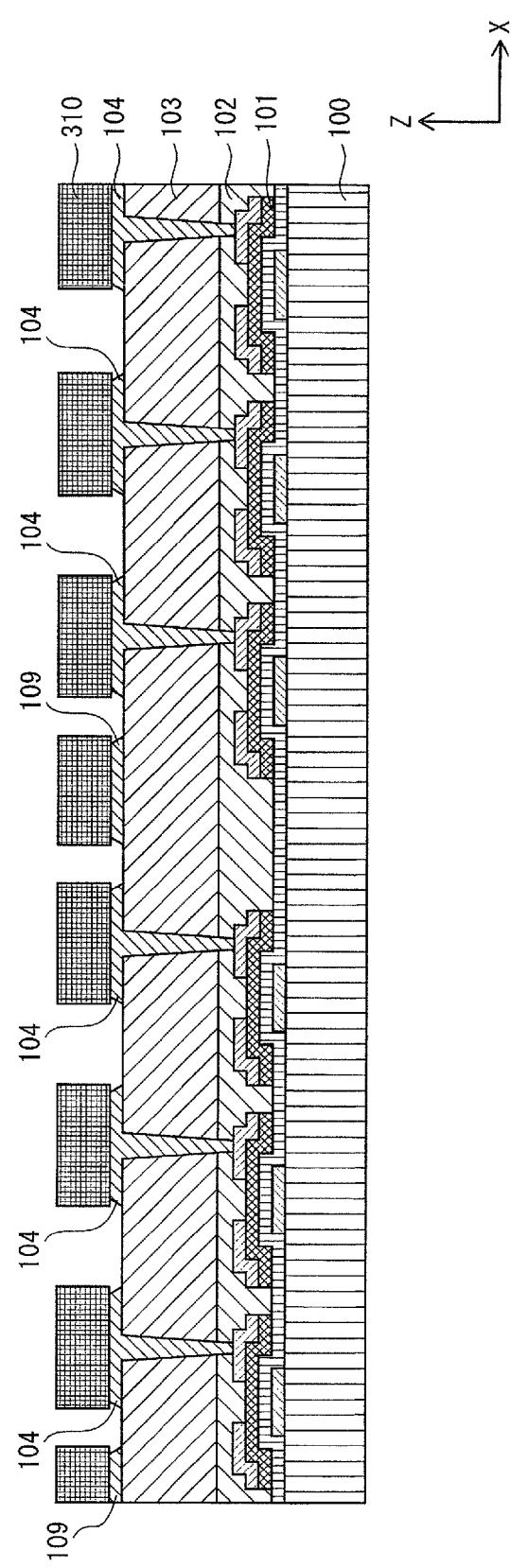
FIG. 21A
FIG. 21B

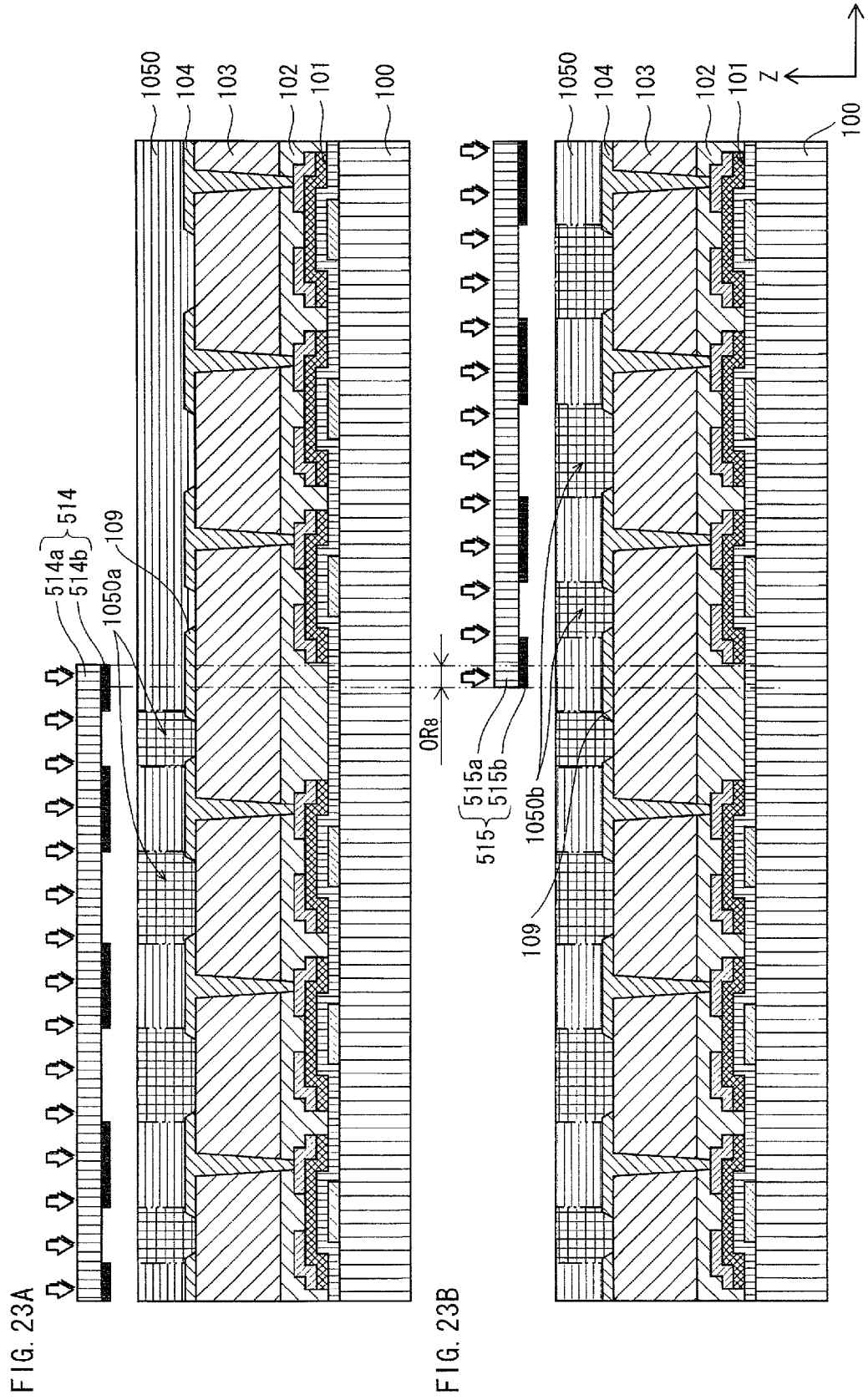

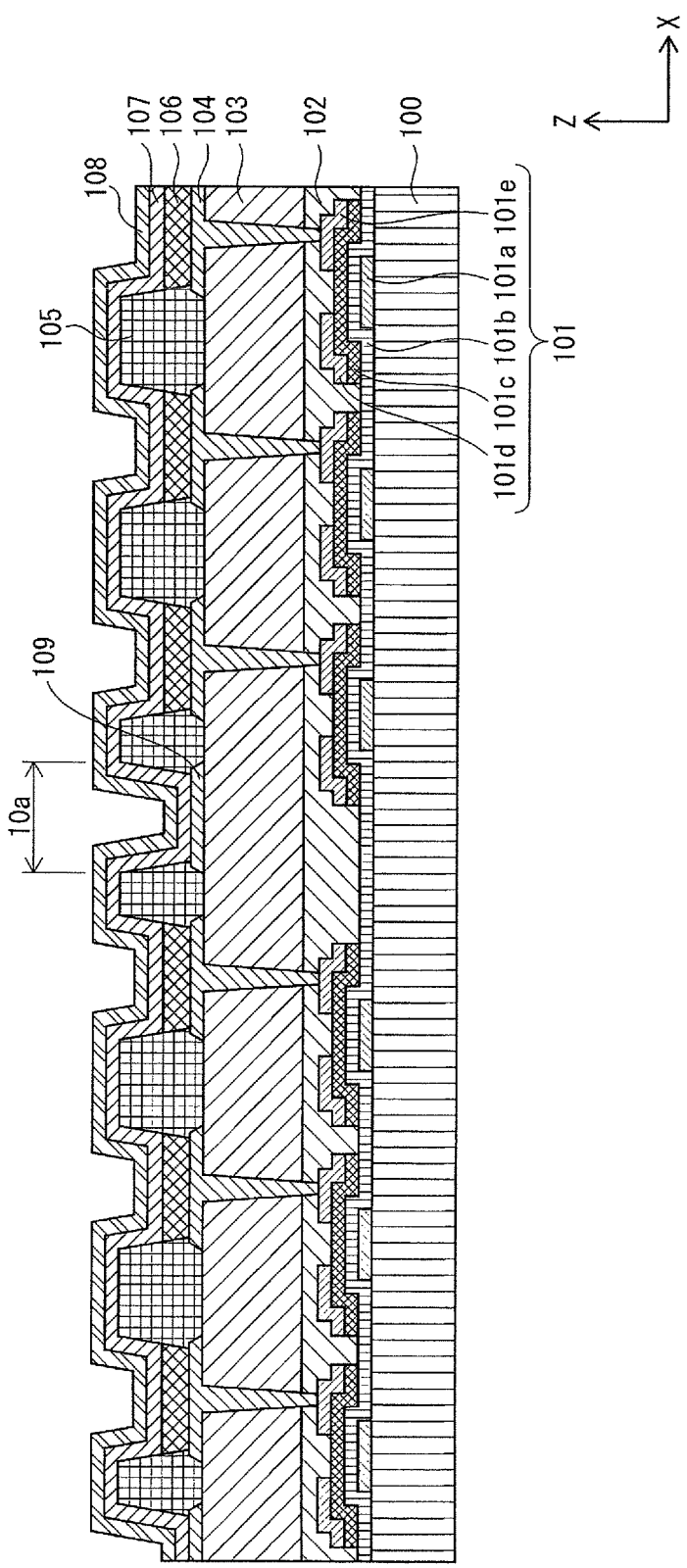

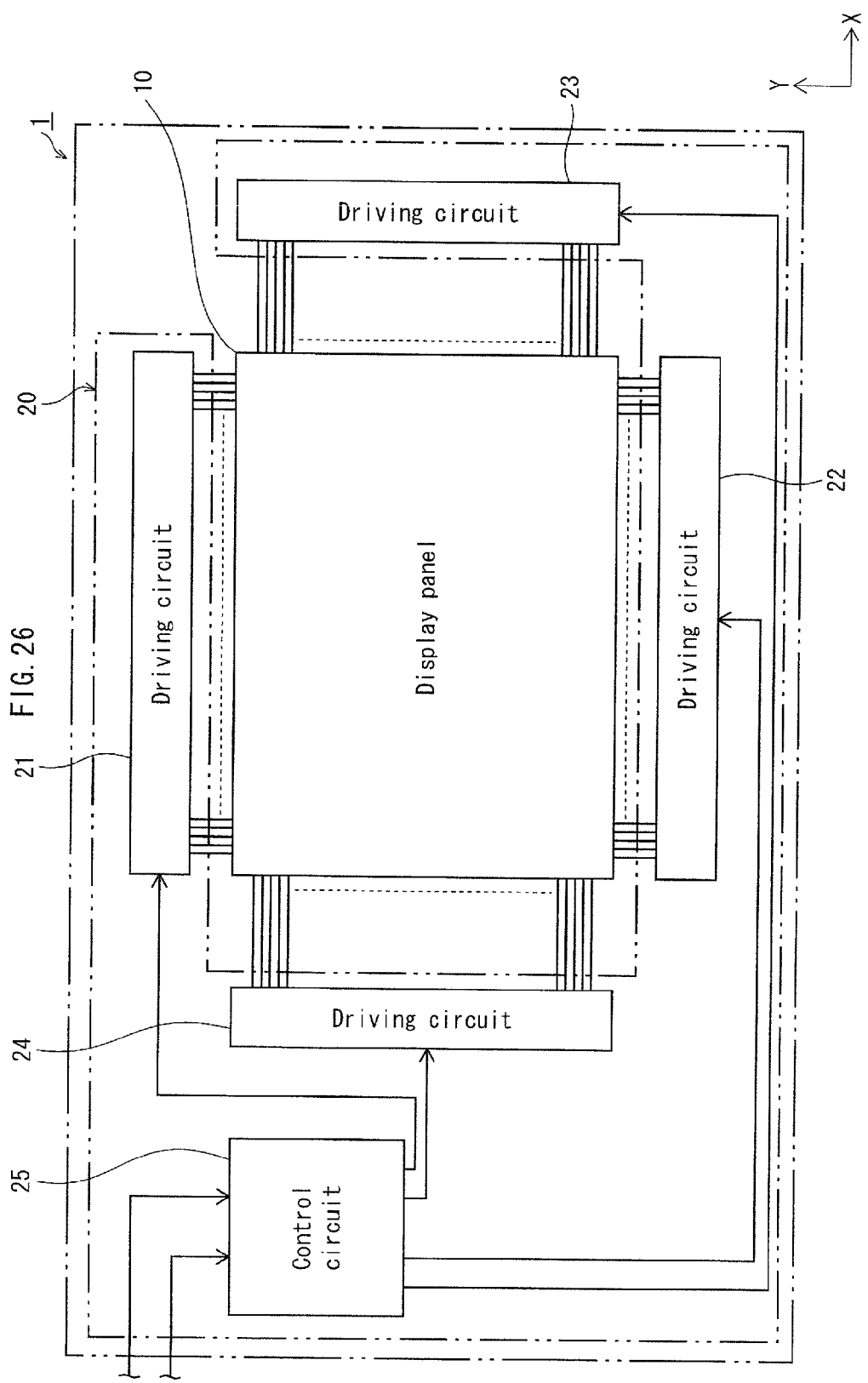

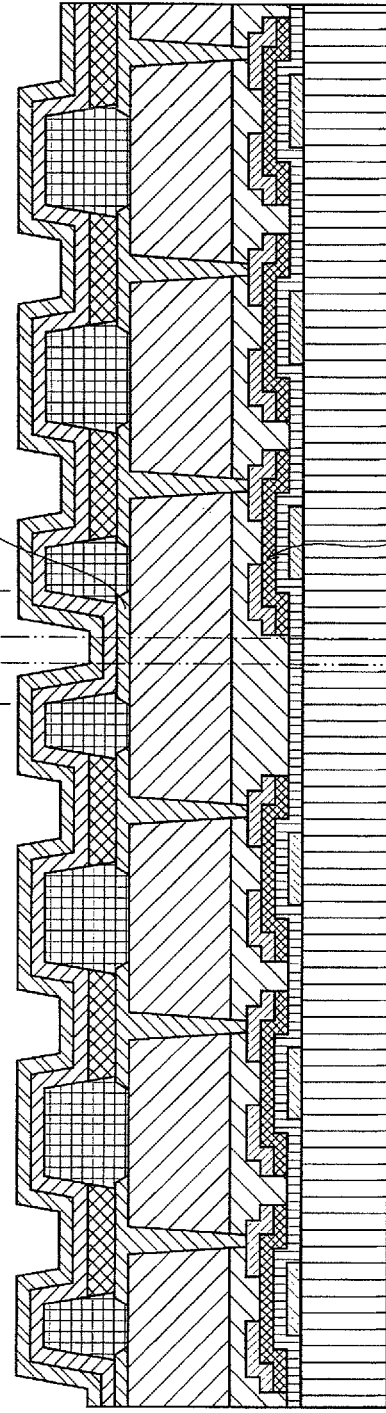
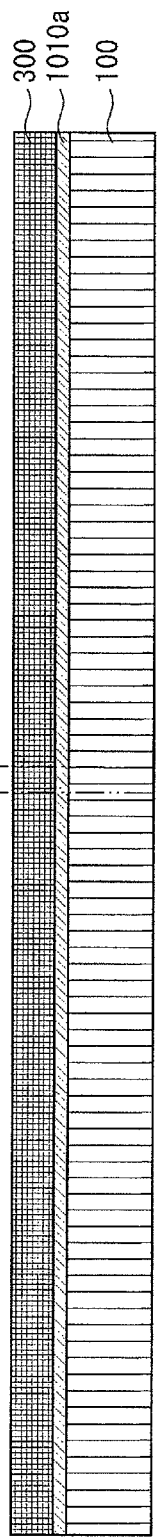
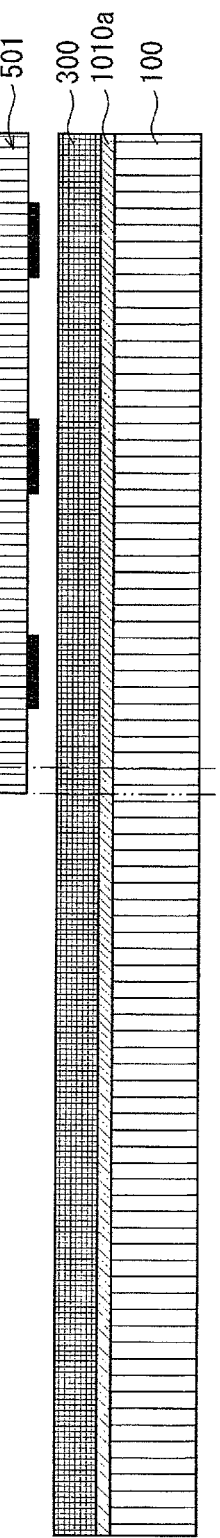
FIG. 27A
FIG. 27B
FIG. 27C

1st mask — Sub-pixel — Wiring (bus bar) — Overlap — 2nd mask

1st mask   Sub-pixel   Wiring (bus bar)
Overlap   2nd mask

DEVICE MANUFACTURING METHOD AND ORGANIC EL DEVICE

CROSS REFERENCE TO RELATED APPLICATION

This is a continuation application of PCT Application No. PCT/JP2011/007026 filed Dec. 15, 2011, designating the United States of America, the disclosure of which, including the specification, drawings and claims, is incorporated herein by reference in its entirety.

TECHNICAL FIELD

The present disclosure relates to a device manufacturing method and an organic EL device, and in particular to an arrangement form of photomasks for exposures to be performed in the manufacturing process.

DESCRIPTION OF THE RELATED ART

An organic EL device is formed through, for example, the steps of: (a) forming a TFT layer on a substrate; (b) forming an inter-layer insulation film on the TFT layer; (c) forming a planarization layer on the inter-layer insulation film; (d) forming an anode on the planarization layer; (e) forming a bank to separate adjacent light-emitting portions; (f) forming a functional layer, which includes an organic light-emitting layer, in concaves that are formed when the bank is formed; (g) forming a cathode to cover and in connection with the functional layer in the concaves; and (h) forming a passivation film to cover the cathode.

It should be noted here that the manufacturing of a device such as an organic EL device includes many steps of performing exposure and development onto a photosensitive film. For example, in the above step of (a) forming a TFT layer, an exposure step and a development step are performed in each formation of a gate electrode, a semiconductor layer, and a source/drain electrode.

Meanwhile, the sizes of the photomasks to be used in the exposures are defined by Generation in the manufacture line. For example, Generation 6 is defined as 800 mm×920 mm (32 inches). As a result, depending on the size of the exposure-target device, one exposure step may need to be divided into a plurality of exposures (divisional exposure method). Here, the divisional exposure method is described with reference to FIG. 32.

As shown in FIG. 32A, a metal film $9010a$ and a positive-type resist film 930 are formed on a substrate 900 in the stated order, and then a photomask 590 is arranged to cover a part of the resist film 930. The photomask 590 is composed of a light-transmissive substrate $590a$ and light-shielding regions $590b$, wherein the light-shielding regions $590b$ are formed on a main surface of the light-transmissive substrate $590a$ facing downward in a Z axis direction so that a pattern is formed. The first exposure is performed and in which the part of the resist film 930 covered by the photomask 590 is exposed to light.

Next, as shown in FIG. 32B, a photomask 591 is arranged to cover another part of the resist film 930, and in this state, the second exposure is performed and in which the other part of the resist film 930 covered by the photomask 591 is exposed to light. Like the photomask 590, the photomask 591 is composed of a light-transmissive substrate $591a$ and light-shielding regions $591b$, wherein the light-shielding regions $591b$ are formed on a main surface of the light-transmissive substrate $591a$ facing downward in the Z axis direction so that a pattern is formed.

Here, the photomask 591 for the second exposure is arranged such that an end thereof overlaps with an end of the photomask 590 arranged for the first exposure (a region of the panel corresponding to the overlap is an overlap region $OR_{900}$).

CITATION LIST

Patent Literature

[Patent Literature 1]
Japanese Patent No. 4604752
[Patent Literature 2]
Japanese Patent Application Publication No. 2006-40589
[Patent Literature 3]
Japanese Patent Application Publication No. 2005-203345

SUMMARY

However, since the overlap region $OR_{900}$ shown in FIGS. 32A and 32B goes through two exposures, the overlap region $OR_{900}$ may change in shape and property after the development is performed and become different from the other regions. For example, the overlap region $OR_{900}$ may have small differences in level after it goes through the development and etching.

Accordingly, when the overlap region $OR_{900}$ happens to be a part of the device that affects greatly the primary property of the device, the quality of the device might be lowered.

One non-limiting and exemplary embodiment provides a device manufacturing method to restrict deterioration of the device properties even when the manufacturing process adopts the divisional exposure method, and to provide an organic EL device.

In one general aspect, the techniques disclosed here feature a device manufacturing method comprising:

(a) a substrate preparation of preparing a substrate;

(b) a pixel electrode formation of forming, on the substrate, a plurality of pixel electrodes arranged at intervals and forming one or more electrical wires each between adjacent pixel electrodes among the plurality of pixel electrodes;

(c) a photosensitive film formation of forming a photosensitive film by applying a photosensitive material onto the substrate;

(d) a first part exposure of, after an execution of the photosensitive film formation, arranging a first photomask to face the substrate and performing an exposure to cause a first part of the photosensitive film to be exposed to light via the first photomask;

(e) a second part exposure of, after or together with an execution of the first part exposure, arranging a second photomask to face the substrate and performing an exposure to cause a second part of the photosensitive film, which is different from the first part at least partially, to be exposed to light via the second photomask; and (f) a development of developing the photosensitive film of which the first part and the second part have been exposed to light in the first part exposure and the second part exposure, respectively.

The device manufacturing method in one general aspect of the present disclosure is characterized in that: in (e) the second part exposure, the second photomask is arranged such that an end thereof overlaps with an end of the first photomask arranged in (d) the first part exposure, and in (b) the pixel electrode formation, (d) the first part exposure, and (e) the second part exposure, an overlap between the first photomask and the second photomask positionally corresponds to an electrical wire among the one or more electrical wires.

In the device manufacturing method in one general aspect of the present disclosure, in (e) the second part exposure, the second photomask is arranged such that an end thereof overlaps with an end of the first photomask arranged in (d) the first part exposure. This makes it possible to restrict deterioration of the device properties. That is to say, with the above structure in which the overlap between the first photomask and the second photomask is arranged within a range positionally corresponding to an electrical wire, the device properties can be restricted from being deteriorated greatly even if a portion of the panel corresponding to the overlap is affected by the exposures.

Accordingly, the device manufacturing method in one general aspect of the present disclosure can restrict deterioration of the device properties even when the manufacturing process adopts the divisional exposure method.

These general and specific aspects may be implemented using a device.

Additional benefits and advantages of the disclosed embodiments will be apparent from the specification and Figures. The benefits and/or advantages may be individually provided by the various embodiments and features of the specification and drawings disclosure, and need not all be provided in order to obtain one or more of the same.

BRIEF DESCRIPTION OF DRAWINGS

FIGS. 2A to 2C are schematic cross-sectional views illustrating a part of the manufacturing step of the organic EL apparatus 1.

FIGS. 3A and 3B are schematic cross-sectional views illustrating a part of the manufacturing step of the organic EL apparatus 1.

FIGS. 4A and 4B are schematic cross-sectional views illustrating a part of the manufacturing step of the organic EL apparatus 1.

FIGS. 5A to 5C are schematic cross-sectional views illustrating a part of the manufacturing step of the organic EL apparatus 1.

FIGS. 6A and 6B are schematic cross-sectional views illustrating a part of the manufacturing step of the organic EL apparatus 1.

FIGS. 8A and 8B are schematic cross-sectional views illustrating a part of the manufacturing step of the organic EL apparatus 1.

FIGS. 9A and 9B are schematic cross-sectional views illustrating a part of the manufacturing step of the organic EL apparatus 1.

FIGS. 10A to 10C are schematic cross-sectional views illustrating a part of the manufacturing step of the organic EL apparatus 1.

FIGS. 14A and 14B are schematic cross-sectional views illustrating a part of the manufacturing step of the organic EL apparatus 1.

FIGS. 17A and 17B are schematic cross-sectional views illustrating a part of the manufacturing step of the organic EL apparatus 1.

FIGS. 19A and 19B are schematic cross-sectional views illustrating a part of the manufacturing step of the organic EL apparatus 1.

FIGS. 20A and 20B are schematic cross-sectional views illustrating a part of the manufacturing step of the organic EL apparatus 1.

FIGS. 21A and 21B are schematic cross-sectional views illustrating a part of the manufacturing step of the organic EL apparatus 1.

FIGS. 23A and 23B are schematic cross-sectional views illustrating a part of the manufacturing step of the organic EL apparatus 1.

FIG. 25 is a schematic cross-sectional view illustrating the structure of the organic EL panel 10 in the organic EL apparatus 1.

FIG. 26 is a schematic block diagram showing the structure of the organic EL apparatus 1.

FIG. 27A is a cross-sectional view illustrating the structure of the organic EL panel 10; FIG. 27B is a schematic cross-sectional view illustrating the first exposure step in the gate electrode forming step; and FIG. 27C is a schematic cross-sectional view illustrating the second exposure step in the gate electrode forming step.

Figure 1:
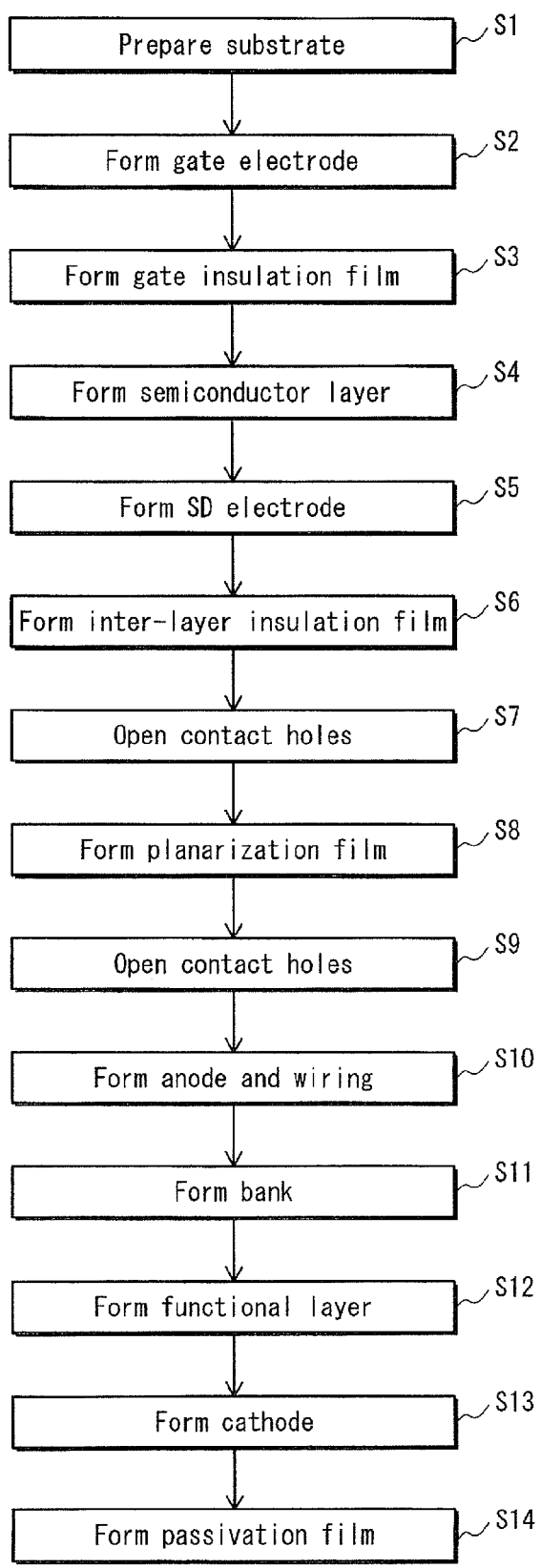
FIG. 1 illustrates a manufacturing step of an organic EL panel 10 among a manufacturing step of an organic EL apparatus 1 in an embodiment of the present disclosure.

32B is a schematic cross-sectional view illustrating the second exposure step of the conventional technology.

DETAILED DESCRIPTION

[Outline of Aspects of the Present Disclosure]

In one general aspect, the techniques disclosed here feature a device manufacturing method comprising:

(a) a substrate preparation of preparing a substrate;

(b) a pixel electrode formation of forming, on the substrate, a plurality of pixel electrodes arranged at intervals and forming one or more electrical wires each between adjacent pixel electrodes among the plurality of pixel electrodes;

(c) a photosensitive film formation of forming a photosensitive film by applying a photosensitive material onto the substrate;

(d) a first part exposure of, after an execution of the photosensitive film formation, arranging a first photomask to face the substrate and performing an exposure to cause a first part of the photosensitive film to be exposed to light via the first photomask;

(e) a second part exposure of, after or together with an execution of the first part exposure, arranging a second photomask to face the substrate and performing an exposure to cause a second part of the photosensitive film, which is different from the first part at least partially, to be exposed to light via the second photomask; and (f) a development of developing the photosensitive film of which the first part and the second part have been exposed to light in the first part exposure and the second part exposure, respectively.

The device manufacturing method in one general aspect of the present disclosure is characterized in that: in (e) the second part exposure, the second photomask is arranged such that an end thereof overlaps with an end of the first photomask arranged in (d) the first part exposure, and in (b) the pixel electrode formation, (d) the first part exposure, and (e) the second part exposure, an overlap between the first photomask and the second photomask positionally corresponds to an electrical wire among the one or more electrical wires.

In the device manufacturing method in one general aspect of the present disclosure, in (d) the first part exposure and (e) the second part exposure, an overlap between the first photomask and the second photomask positionally corresponds to an electrical wire among the one or more electrical wires. This makes it possible to restrict deterioration of the device properties. That is to say, with the above structure in which the overlap between the first photomask and the second photomask is arranged within a range positionally corresponding to an electrical wire, the device properties can be restricted from being deteriorated greatly even if a portion of the panel corresponding to the overlap is affected by the exposures.

Accordingly, the device manufacturing method in one general aspect of the present disclosure can restrict deterioration of the device properties even when the manufacturing process adopts the divisional exposure method.

In the above device manufacturing method, in the pixel electrode formation, each of the one or more electrical wires may be formed as a straight line on a surface of the substrate and to be larger in width than the overlap between the first photomask and the second photomask. With adoption of such a structure, it is possible to set the overlap region of the exposures to be within a region corresponding to the electric wire formation region in a reliable manner, and restrict deterioration of the device properties.

In the above device manufacturing method, the photosensitive film formation may be performed after the pixel electrode formation is performed. With this structure, when a portion higher than the level of the layer, in which the electrical wires are formed, is formed, it is possible to set the overlap region of the exposures to be within a region corresponding to the electric wire formation region, and restrict deterioration of the device properties.

In the above device manufacturing method, the pixel electrode formation may be performed after the photosensitive film formation, the first part exposure, the second part exposure, and the development are performed. With this structure, when a portion lower than the level of the layer, in which the electrical wires are to be formed, is formed, it is possible to set the overlap region of the exposures to be within a region corresponding to the electric wire formation region, and restrict deterioration of the device properties.

In the above device manufacturing method, a mask pattern may have been formed in at least one partial region of each of the first photomask and the second photomask, and the overlap between the first photomask and the second photomask may be an overlap between the mask pattern of the first mask pattern and the mask pattern of the second photomask.

In one general aspect, the techniques disclosed here feature a device manufacturing method comprising:

(a) a substrate preparation of preparing a substrate;

(b) a pixel electrode formation of forming, on the substrate, a plurality of pixel electrodes arranged at intervals;

(c) a photosensitive film formation of forming a photosensitive film by applying a photosensitive material onto the substrate;

(d) a first part exposure of, after an execution of the photosensitive film formation, arranging a first photomask to face the substrate and performing an exposure to cause a first part of the photosensitive film to be exposed to light via the first photomask;

(e) a second part exposure of, after or together with an execution of the first part exposure, arranging a second photomask to face the substrate and performing an exposure to cause a second part of the photosensitive film, which is different from the first part at least partially, to be exposed to light via the second photomask; and (f) a development of developing the photosensitive film of which the first part and the second part have been exposed to light in the first part exposure and the second part exposure, respectively.

The device manufacturing method in one general aspect of the present disclosure is characterized in that: a region in which the plurality of pixel electrodes are formed includes a first pixel electrode formation region and a second pixel electrode formation region, and in (b) the pixel electrode formation, the plurality of pixel electrodes are formed such that a gap between adjacent pixel electrodes in the second pixel electrode formation region is larger than a gap between adjacent pixel electrodes in the first pixel electrode formation region, in (e) the second part exposure, the second photomask is arranged such that an end thereof overlaps with an end of the first photomask arranged in (d) the first part exposure, and in (b) the pixel electrode formation, (d) the first part exposure, and (e) the second part exposure, an overlap between the first photomask and the second photomask positionally corresponds to the second pixel electrode formation region.

In the device manufacturing method in one general aspect of the present disclosure, in (d) the first part exposure and (e) the second part exposure, an overlap between the first photomask and the second photomask positionally corresponds to the second pixel electrode formation region in which a gap between adjacent pixel electrodes is relatively large (a region with a gap between adjacent pixel electrodes). This makes it possible to restrict deterioration of the device properties. That is to say, with the above structure in which the overlap between the first photomask and the second photomask is arranged within a range positionally corresponding to the second pixel electrode formation region in which a gap between adjacent pixel electrodes is relatively large, the device properties can be restricted from being deteriorated greatly. This is because, even if a portion of the panel corresponding to the overlap is affected by the exposures, it does not make an effect on the pixel electrodes and the layers positioned on and under the pixel electrodes.

Accordingly, the device manufacturing method in one general aspect of the present disclosure can restrict deterioration of the device properties even when the manufacturing process adopts the divisional exposure method.

In the above device manufacturing method, in (b) the pixel electrode formation, a metal film may be formed as a straight line in the second pixel electrode formation region, and in (b) the pixel electrode formation, (d) the first part exposure, and (e) the second part exposure, the overlap between the first photomask and the second photomask may positionally correspond to the metal film.

In the above device manufacturing method, (c) the photosensitive film formation may be performed after (b) the pixel electrode formation is performed. With adoption of this structure, when an exposure is performed onto a portion higher than the level of the layer in which the pixel electrodes are formed, it is possible to set the overlap between the first photomask and the second photomask as described above, and manufacture high-quality devices.

In the above device manufacturing method, (b) the pixel electrode formation may be performed after (c) the photosensitive film formation, (d) the first part exposure, (e) the second part exposure, and (f) the development are performed. With adoption of this structure, when an exposure is performed onto a portion lower than the level of the layer in which the pixel electrodes are formed, it is possible to set the overlap between the first photomask and the second photomask as described above, and manufacture high-quality devices.

In one general aspect, the techniques disclosed here feature a device manufacturing method comprising:

(a) a substrate preparation of preparing a substrate;

(b) an electrode material film formation of forming, on the substrate, an electrode material film which contains an electrode material;

(c) a photosensitive film formation of forming a photosensitive film by applying a photosensitive material onto the electrode material film;

(d) a first part exposure of, after an execution of the photosensitive film formation, arranging a first photomask to face the substrate and performing an exposure to cause a first part of the photosensitive film to be exposed to light via the first photomask;

(e) a second part exposure of, after or together with an execution of the first part exposure, arranging a second photomask to face the substrate and performing an exposure to cause a second part of the photosensitive film, which is different from the first part at least partially, to be exposed to light via the second photomask;

(f) a development of developing the photosensitive film of which the first part and the second part have been exposed to light in the first part exposure and the second part exposure, respectively; and (g) a pixel electrode formation of forming, on the substrate, a plurality of pixel electrodes arranged at intervals and forming one or more electrical wires each between adjacent pixel electrodes among the plurality of pixel electrodes by etching the electrode material film via the photosensitive film that has gone through a development performed in the development.

The device manufacturing method in one general aspect of the present disclosure is characterized in that, in (e) the second part exposure, the second photomask is arranged such that an end thereof overlaps with an end of the first photomask arranged in (d) the first part exposure, and an overlap between the first photomask and the second photomask is arranged to be positioned above a region in which an electrical wire among the one or more electrical wires is to be formed.

In the device manufacturing method in one general aspect of the present disclosure, in (d) the first part exposure and (e) the second part exposure, an overlap between the first photomask and the second photomask is arranged to be positioned above a region in which an electrical wire is to be formed. This makes it possible to restrict deterioration of the device properties. That is to say, with the above structure in which the overlap of exposures is arranged to be positioned above a region in which an electrical wire is to be formed, the region not being likely to affect the device properties greatly in the device, the device properties can be restricted from being deteriorated greatly. This is because, even if a portion of the panel corresponding to the overlap is affected by the exposures, it does not make an effect on the pixel electrodes and the layers positioned on and under the pixel electrodes.

Accordingly, the device manufacturing method in one general aspect of the present disclosure can restrict deterioration of the device properties even when the manufacturing process adopts the divisional exposure method.

In one general aspect, the techniques disclosed here feature a device manufacturing method comprising:

(a) a substrate preparation of preparing a substrate;

(b) an electrode material film formation of forming, on the substrate, an electrode material film which contains an electrode material;

(c) a photosensitive film formation of forming a photosensitive film by applying a photosensitive material onto the electrode material film;

(d) a first part exposure of, after an execution of the photosensitive film formation, arranging a first photomask to face the substrate and performing an exposure to cause a first part of the photosensitive film to be exposed to light via the first photomask;

(e) a second part exposure of, after or together with an execution of the first part exposure, arranging a second photomask to face the substrate and performing an exposure to cause a second part of the photosensitive film, which is different from the first part at least partially, to be exposed to light via the second photomask;

(f) a development of developing the photosensitive film of which the first part and the second part have been exposed to light in the first part exposure and the second part exposure, respectively; and (g) a pixel electrode formation of forming, on the substrate, a plurality of pixel electrodes arranged at intervals by etching the electrode material film via the photosensitive film that has gone through a development performed in the development.

The device manufacturing method in one general aspect of the present disclosure is characterized in that: a region in which the plurality of pixel electrodes are formed includes a first pixel electrode formation region and a second pixel electrode formation region, and in (b) the electrode material film formation through (g) the pixel electrode formation, the plurality of pixel electrodes are formed such that a gap between adjacent pixel electrodes in the second pixel electrode formation region is larger than a gap between adjacent pixel electrodes in the first pixel electrode formation region, in (e) the second part exposure, the second photomask is arranged such that an end thereof overlaps with an end of the first photomask arranged in (d) the first part exposure, and an overlap between the first photomask and the second photomask is arranged to be positioned above the second pixel electrode formation region.

In the device manufacturing method in one general aspect of the present disclosure, in (d) the first part exposure and (e) the second part exposure, an overlap between the first photomask and the second photomask positionally corresponds to the second pixel electrode formation region in which a gap between adjacent pixel electrodes is relatively large (a region with a gap between adjacent pixel electrodes). This makes it possible to restrict deterioration of the device properties. That is to say, with the above structure in which the overlap between the first photomask and the second photomask is arranged within a range positionally corresponding to the second pixel electrode formation region in which a gap between adjacent pixel electrodes is relatively large, the device properties can be restricted from being deteriorated greatly. This is because, even if a portion of the panel corresponding to the overlap is affected by the exposures, it does not make an effect on the pixel electrodes and the layers positioned on and under the pixel electrodes.

Accordingly, the device manufacturing method in one general aspect of the present disclosure can restrict deterioration of the device properties even when the manufacturing process adopts the divisional exposure method.

In another general aspect, the techniques disclosed here feature an organic EL device, comprising: a substrate; a plurality of pixel electrodes arranged at intervals on the substrate, each pixel electrode containing an electrode material; one or more electrical wires each of which is provided between adjacent pixel electrodes among the plurality of pixel electrodes on the substrate; one or more banks formed by causing a photosensitive material film to be exposed to light via a plurality of photomasks that are arranged such that adjacent photomasks overlap with each other partially, each of the one or more banks positioned to separate adjacent pixel electrodes and to separate a pixel electrode from an electrical wire, the one or more banks defining one or more sub-pixel regions and one or more electrical wire regions; a plurality of organic layers containing a luminescent organic material and being arranged in one-to-one correspondence with the plurality of pixel electrodes in the one or more sub-pixel regions; and a common electrode facing the plurality of pixel electrodes via the plurality of organic layers, and facing the one or more electrical wires.

The organic EL device in another general aspect of the present disclosure is characterized in that each surface, facing the common electrode, of the one or more electrical wires in the one or more electrical wire regions is larger in width than each overlap between adjacent photomasks.

With adoption of the above structure where each surface, facing the common electrode, of the one or more electrical wires is larger in width than each overlap between adjacent photomasks, it is possible, in the manufacturing of the organic EL device, to arrange a plurality of photomasks such that each overlap between adjacent photomasks among the plurality of photomasks is set to be within a range corresponding to an electrical wire region. This makes it possible to restrict deterioration of the device properties. This is because, even if a portion of the panel corresponding to the overlap goes through two or more exposures, it does not make an effect on the pixels which directly affect the display quality.

Accordingly, the organic EL device in another general aspect of the present disclosure can provide a high display quality.

In another general aspect, the techniques disclosed here feature an organic EL device, comprising: a substrate; a plurality of pixel electrodes arranged at intervals on the substrate; one or more electrical wires each of which is provided between adjacent pixel electrodes among the plurality of pixel electrodes on the substrate; one or more banks formed by causing a photosensitive material film to be exposed to light via a plurality of photomasks that are arranged such that adjacent photomasks overlap with each other partially, each of the one or more banks positioned to separate adjacent pixel electrodes and to separate a pixel electrode from an electrical wire, the one or more banks defining one or more sub-pixel regions and one or more electrical wire regions; a plurality of organic layers containing a luminescent organic material and being arranged in one-to-one correspondence with the plurality of pixel electrodes in the one or more sub-pixel regions; and a common electrode facing the plurality of pixel electrodes via the plurality of organic layers, and facing the one or more electrical wires.

The organic EL device in another general aspect of the present disclosure is characterized in that each surface of the one or more electrical wires functions as an overlap between adjacent photomasks.

With adoption of the above structure where each surface of the one or more electrical wires functions as an overlap between adjacent photomasks, it is possible to restrict deterioration of the device properties even if a portion of the panel corresponding to the overlap goes through two or more exposures. That is to say, since the electrical wires in the organic EL device have a constant reflection rate, even if a portion of the panel corresponding to the overlap goes through two or more exposures, the shape is stable. Therefore, by causing each surface of the one or more electrical wires to function as an overlap between adjacent photomasks, it is possible to obtain a high display quality.

Accordingly, the organic EL device in another general aspect of the present disclosure can provide a high display quality.

In another general aspect, the techniques disclosed here feature an organic EL device, comprising: a substrate; a plurality of pixel electrodes arranged at intervals on the substrate; one or more electrical wires each of which is provided between adjacent pixel electrodes among the plurality of pixel electrodes on the substrate; one or more banks formed by causing a photosensitive material film to be exposed to light via a plurality of photomasks that are arranged such that adjacent photomasks overlap with each other partially, each of the one or more banks positioned to separate adjacent pixel electrodes and to separate a pixel electrode from an electrical wire, the one or more banks defining one or more sub-pixel regions and one or more electrical wire regions; a plurality of organic layers containing a luminescent organic material and being arranged in one-to-one correspondence with the plurality of pixel electrodes in the one or more sub-pixel regions; and a common electrode facing the plurality of pixel electrodes via the plurality of organic layers, and facing the one or more electrical wires.

The organic EL device in another general aspect of the present disclosure is characterized in that the one or more electrical wire regions have a sign of exposures having been performed with use of the plurality of photomasks arranged such that adjacent photomasks overlap with each other partially.

In the above structure, the one or more electrical wire regions have a sign of exposures having been performed with use of the plurality of photomasks arranged such that adjacent photomasks overlap with each other partially. In other words, it indicates that exposures were performed by using the plurality of photomasks that were arranged such that adjacent photomasks overlap with each other partially. As described above, this structure does not affect the display quality greatly. Also, since the electrical wires have a constant reflection rate, even if a portion of the panel corresponding to the overlap goes through two or more exposures, the shape is stable. Therefore, with this structure, it is possible to prevent two exposures from affecting the pixel regions which directly affect the display quality.

Accordingly, the organic EL device in another general aspect of the present disclosure can provide a high display quality.

Exemplary Embodiment

In the following, the characteristics, acts and effects of the present disclosure are explained by way of a specific example. Note that the present disclosure is not limited to the following exemplary embodiment except for structural elements that are essential to the present disclosure.

1. Manufacturing Method of Organic EL Panel 10

First, a manufacturing method of an organic EL panel 10 of the present embodiment is described with reference to FIGS. 1 through 25. Note that the organic EL panel 10 of the present embodiment is one example of the device.

(1) Formation of TFT Layer 101

As shown in FIG. 2A, a substrate 100 is prepared (step S1 in FIG. 1). The substrate 100 may be a glass substrate, a quartz substrate, a silicon substrate, a metal substrate, a semiconductor substrate, a resin substrate or the like, wherein the metal substrate may be made of, for example, molybdenum sulfide, copper, zinc, aluminum, stainless steel, magnesium, iron, nickel, gold, silver or the like, and the semiconductor substrate may be made of gallium arsenide group or the like.

The resin substrate may be made of a thermoplastic resin or a thermosetting resin. The material of the resin substrate may be, for example, polyolefin (e.g., polyethylene, polypropylene, ethylene-propylene copolymer, ethylene-vinyl acetate copolymer (EVA)), cyclic polyolefin, denatured polyolefin, polyvinyl chloride, polyvinylidene chloride, polystyrene, polyamide, polyimide (PI), polyamide-imide, polycarbonate, poly-(4-methylpentene-1), ionomer, acrylic resin, polymethyl methacrylate, acrylic-styrene copolymer (AS resin), butadiene-styrene copolymer, ethylene-vinyl alcohol copolymer (EVOH), polyester (e.g., polyethylene terephthalate (PET), polybutylene terephthalate, polyethylene naphthalate (PEN), polycyclohexane terephthalate (PCT)), polyether, polyether ketone, polyether sulfone (PES), polyether imide, polyacetal, polyphenylene oxide, denatured polyphenylene oxide, polyarylate, aromatic polyester (e.g., liquid crystal polymer), fluoro resin (e.g., polytetrafluoroethylene, polyfluorovinylidene), thermoplastic elastomer (e.g., styrene-based elastomer, polyolefin-based elastomer, polyvinylchloride-based elastomer, polyurethane-based elastomer, fluororubber-based elastomer, chlorinated polyethylene-based elastomer), epoxy resin, phenolic resin, urea resin, melamine resin, unsaturated polyester, silicone resin, or polyurethane, or a copolymer, a blended body or a polymer alloy each having at least one of these materials as a major component thereof, and the resin substrate may be a laminate of one or more layers of any of these materials.

Subsequently, as shown in FIG. 2B, a metal film 1010a is formed on a main surface of the substrate 100 (the main surface facing upward in the Z axis direction). The metal film 1010a may be formed by the sputtering method or vacuum deposition method.

The material of the metal film 1010a may be, for example, a metal (e.g., chromium, aluminum, tantalum, molybdenum, niobium, copper, silver, gold, platinum, palladium, indium, nickel, or neodymium), an alloy of any of these metals, an electroconductive metal oxide (e.g., zinc oxide, tin oxide, indium oxide, or gallium oxide), an electroconductive metal complex oxide (e.g., indium tin complex oxide (ITO), indium zinc complex oxide (IZO), aluminum zinc complex oxide (AZO), gallium zinc complex oxide (GZO)), an electroconductive polymer (e.g., polyaniline, polypyrrole, polythiophene, or polyacetylene), any of these electroconductive polymers added with a dopant such as an acid (e.g., hydrochloric acid, sulfuric acid, or sulfonic acid), a Lewis acid (e.g., hexafluorophosphate, arsenic pentafluoride, or ferric chloride), a halogen atom (e.g., iodine), or a metal atom (e.g., natrium or potassium), or an electroconductive composite material dispersed with carbon black particles or metal particles. Alternatively, a polymer mixture containing electroconductive particles, such as metal microparticles or graphite particles, may be used. Any single material or a combination of two or more materials of the above materials may be used.

Subsequently, as shown in FIG. 2C, a positive-type resist film 300 is deposited to cover the metal film 1010a.

Following this, as shown in FIG. 3A, a photomask 500 is arranged to cover a part of the upper surface of the resist film 300 deposited on the metal film 1010a. The photomask 500 is composed of a light-transmissive substrate 500a and light-shielding regions 500b, wherein the light-shielding regions 500b are formed on a main surface of the light-transmissive substrate 500a facing downward in the Z axis direction so that a pattern is formed. An exposure is performed in this state, so that a part 300a of the resist film 300 is exposed to light via the photomask 500.

Subsequently, as shown in FIG. 3B, a photomask 501 is arranged to cover another part of the upper surface of the resist film 300. Like the photomask 500, the photomask 501 is composed of a light-transmissive substrate 501a and light-shielding regions 501b, wherein the light-shielding regions 501b are formed on a main surface of the light-transmissive substrate 501a facing downward in the Z axis direction so that a pattern is formed. Here, the photomask 501 is arranged such that an end thereof overlaps with an end of the photomask 500 used in the previous exposure (an overlap region $OR_1$). The positional relationship between them is described below.

In the state shown in FIG. 3B, an exposure is performed so that a part 300b of the resist film 300 is exposed to light via the photomask 501.

Following this, as shown in FIG. 4A, the resist film 300 having gone through the two exposures is developed. This development removes portions 300a and 300b, which have been exposed to light, from the resist film 300 to generate openings 301a, and a patterned resist film 301 is obtained.

Next, as shown in FIG. 4B, the metal film 1010a is etched via the openings 301a of the resist film 301, and a gate electrode 101a of a TFT layer 101 is obtained (step S2 in FIG. 1). The etching performed to form the gate electrode 101a may be dry etching or wet etching.

Next, after removing the resist film 301 as shown in FIG. 5A, an insulation film 1010b is formed to cover the surface of the substrate 100 including the surface of the gate electrode 101a as shown in FIG. 5B. The CVD (Chemical Vapor Deposition) method may be used to form the insulation film 1010b.

The material of the insulation film 1010b may be, for example, silicon nitride (SiN$_x$), silicon oxide (SiO$_x$) or the like.

Subsequently, as shown in FIG. 5C, a positive-type resist film 302 is deposited to cover the insulation film 1010b.

Next, as shown in FIG. 6A, a photomask 502 is arranged to cover a part of the upper surface of the resist film 302 deposited on the insulation film 1010b. With regard to the photomask 502 too, light-shielding regions 502b are formed on a main surface of a light-transmissive substrate 502a facing downward in the Z axis direction so that a pattern is formed. Note that a light-transmissive portion is set outside the range of drawing of FIG. 5A. An exposure is performed in this state, so that the part of the resist film 302 is exposed to light via the photomask 502 (illustration omitted).

Subsequently, as shown in FIG. 6B, a photomask 503 is arranged to cover another part of the upper surface of the resist film 302. With regard to the photomask 503 too, light-shielding regions 503b are formed on a main surface of a light-transmissive substrate 503a facing downward in the Z axis direction so that a pattern is formed. Note that, like the above case, a light-transmissive portion is set outside the range of drawing. Also, in this step too, the photomask 503 is arranged such that an end thereof overlaps with an end of the photomask 502 used in the previous exposure (an overlap region OR$_2$).

An exposure is performed in the state shown in FIG. 6B, so that the other part of the resist film 302 is exposed to light via the photomask 503 (illustration omitted).

Figure 7A:
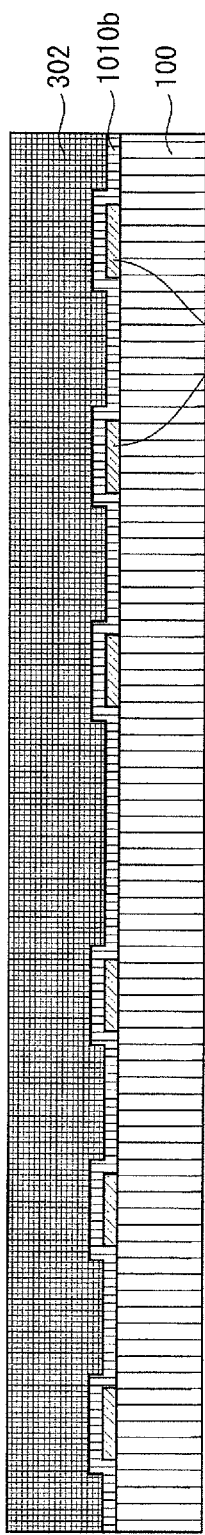
FIGS. 7A to 7D are schematic cross-sectional views illustrating a part of the manufacturing step of the organic EL apparatus 1.

The resist film 302 is developed as shown in FIG. 7A. The development leaves portions that have been blocked by the light-shielding regions 502b and 503b of the photomasks 502 and 503 from being exposed to light, and removes portions that have been exposed to light, the portions having been exposed to light being outside the range of drawing.

Figure 7B:
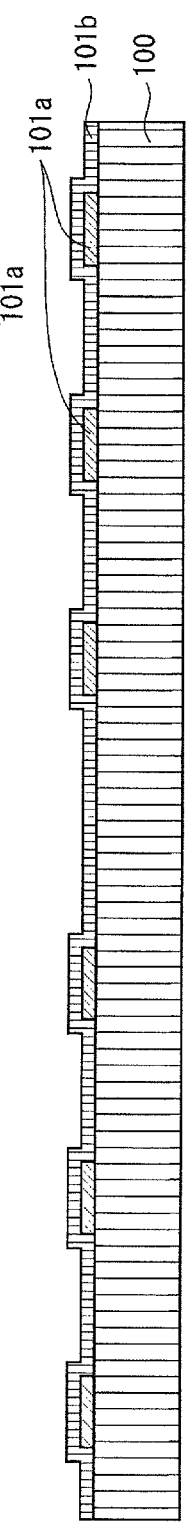

As shown in FIG. 7B, the insulation film 1010b is etched by the dry etching, and a gate insulation film 101b of the TFT layer 101 is obtained (step S3 in FIG. 1). Following this, the resist film 302 is removed.

Figure 7C:
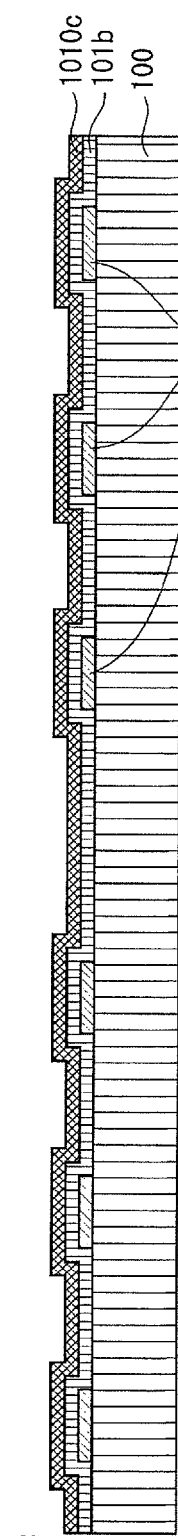

Next, as shown in FIG. 7C, a semiconductor film 1010c is formed to cover the gate insulation film 101b. The CVD method may be used to form the semiconductor film 1010c. The material of the semiconductor film 1010c may be, for example, silicon (Si).

Figure 7D:
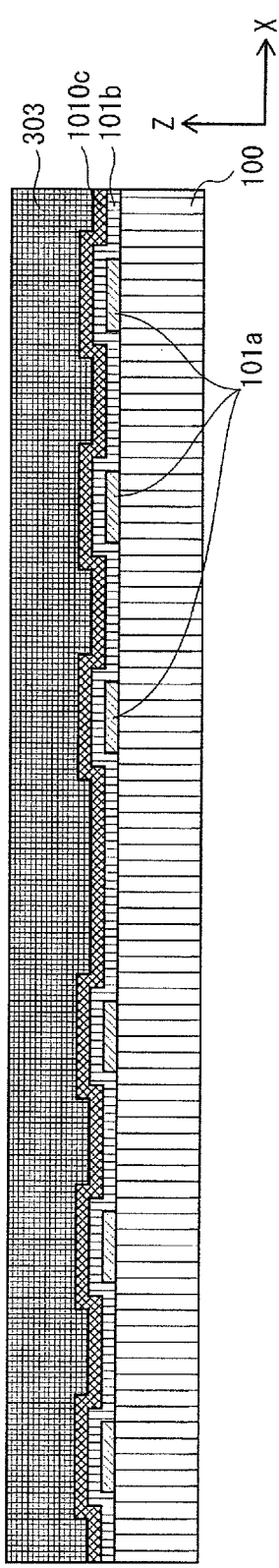

Subsequently, as shown in FIG. 7D, a positive-type resist film 303 is deposited to cover the semiconductor film 1010c.

Following this, as shown in FIG. 8A, a photomask 504 is arranged to cover a part of the upper surface of the resist film 303 deposited on the semiconductor film 1010c. With regard to the photomask 504 too, light-shielding regions 504b are formed on a main surface of a light-transmissive substrate 504a facing downward in the Z axis direction so that a pattern is formed. An exposure is performed in this state, so that a part 303a of the resist film 303 is exposed to light via the photomask 504.

Subsequently, as shown in FIG. 8B, a photomask 505 is arranged to cover another part of the upper surface of the resist film 303. With regard to the photomask 505 too, light-shielding regions 505b are formed on a main surface of a light-transmissive substrate 505a facing downward in the Z axis direction so that a pattern is formed. Here, the photomask 505 is arranged such that an end thereof overlaps with an end of the photomask 504 used in the previous exposure (an overlap region OR$_3$).

In the state shown in FIG. 8B, an exposure is performed so that a part 303b of the resist film 303 is exposed to light via the photomask 505.

Following this, as shown in FIG. 9A, the resist film 303 having gone through the exposure step is developed. This development removes portions, which have been exposed to light, to generate openings 304a, and a resist film 304 with the openings is obtained.

Subsequently, as shown in FIG. 9B, the semiconductor film 1010c is etched by the dry etching, and a semiconductor layer 101c of the TFT layer 101 is obtained (step S4 in FIG. 1).

Next, after the resist film 304 is removed as shown in FIG. 10A, a metal film 1010de is formed to cover the semiconductor layer 101c and the gate insulation film 101b as shown in FIG. 10B. The metal film 1010de may be formed by, for example, the sputtering method, and the material of the metal film 1010de may be, for example as in the gate electrode 101a, a metal (e.g., chromium, aluminum, tantalum, molybdenum, niobium, copper, silver, gold, platinum, palladium, indium, nickel, or neodymium), an alloy of any of these metals, an electroconductive metal oxide (e.g., zinc oxide, tin oxide, indium oxide, or gallium oxide), an electroconductive metal complex oxide (e.g., indium tin complex oxide (ITO), indium zinc complex oxide (IZO), aluminum zinc complex oxide (AZO), gallium zinc complex oxide (GZO)), an electroconductive polymer (e.g., polyaniline, polypyrrole, polythiophene, or polyacetylene), any of these electroconductive polymers added with a dopant such as an acid (e.g., hydrochloric acid, sulfuric acid, or sulfonic acid), a Lewis acid (e.g., hexafluorophosphate, arsenic pentafluoride, or ferric chloride), a halogen atom (e.g., iodine), or a metal atom (e.g., natrium or potassium), or an electroconductive composite material dispersed with carbon black particles or metal particles. Alternatively, a polymer mixture containing electroconductive particles, such as metal microparticles or graphite particles, may be used. Any single material or a combination of two or more materials of the above materials may be used.

Subsequently, as shown in FIG. 10C, a positive-type resist film 305 is deposited to cover the metal film 1010de.

Figure 11A:
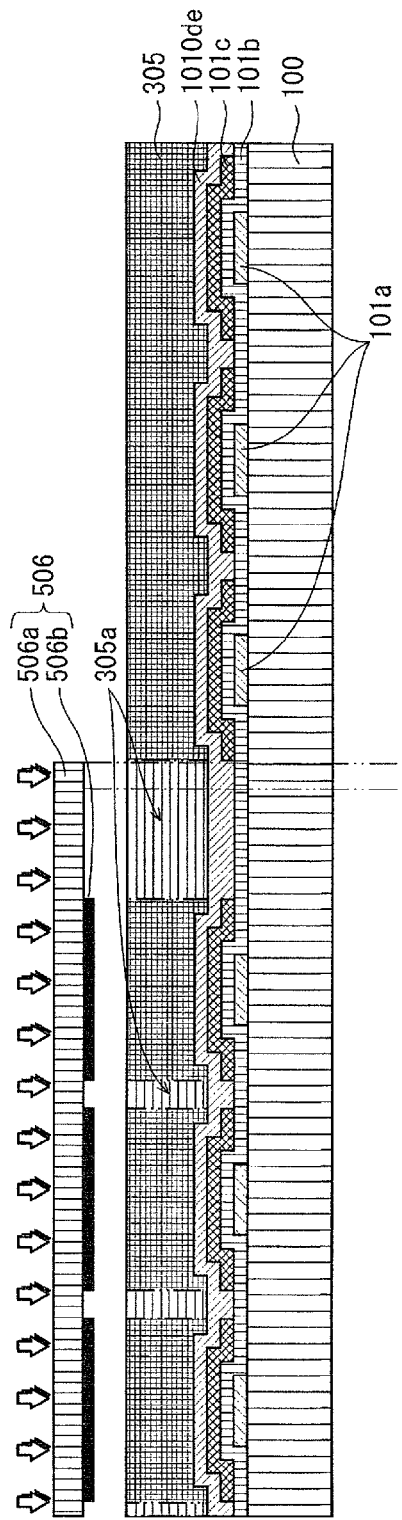
FIGS. 11A and 11B are schematic cross-sectional views illustrating a part of the manufacturing step of the organic EL apparatus 1.

Following this, as shown in FIG. 11A, a photomask 506 is arranged to cover a part of the upper surface of the resist film 305 deposited on the metal film 1010de. With regard to the photomask 506 too, light-shielding regions 506b are formed on a main surface of a light-transmissive substrate 506a facing downward in the Z axis direction so that a pattern is formed. An exposure is performed in this state, so that a part 305a of the resist film 305 is exposed to light via the photomask 506.

Figure 11B:
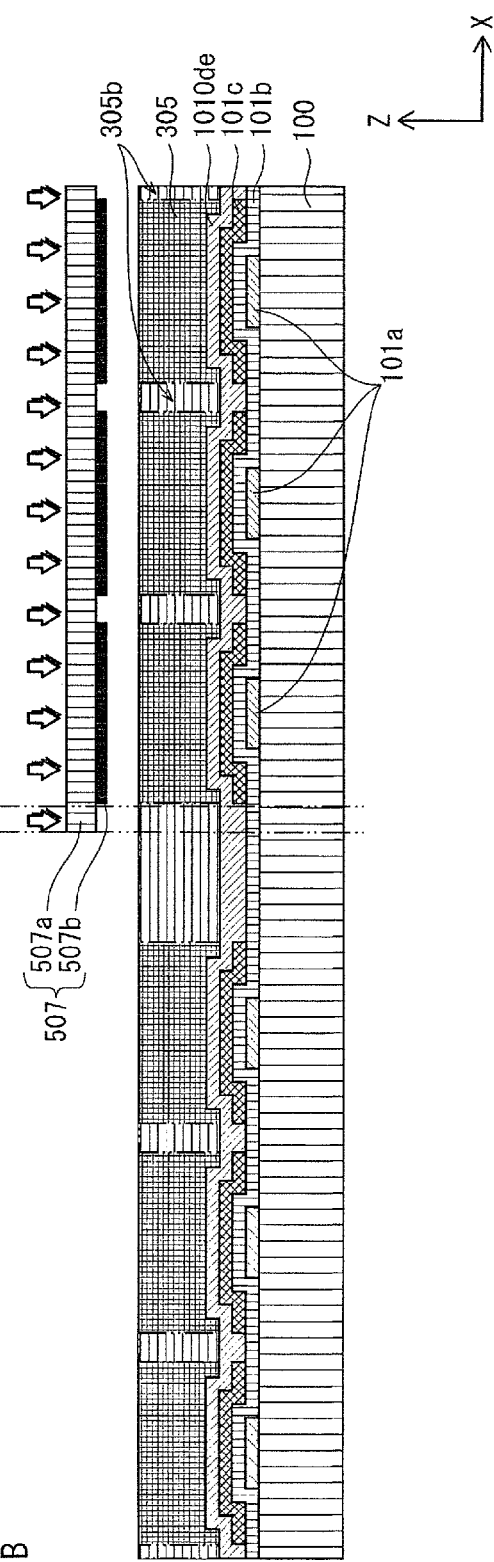

Subsequently, as shown in FIG. 11B, a photomask 507 is arranged to cover another part of the upper surface of the resist film 305. With regard to the photomask 507 too, light-shielding regions 507b are formed on a main surface of a light-transmissive substrate 507a facing downward in the Z axis direction so that a pattern is formed. The photomask 507 is arranged such that an end thereof overlaps with an end of the photomask 506 used in the previous exposure (an overlap region OR$_4$).

An exposure is performed in the state shown in FIG. 11B, so that a part 305b of the resist film 305 is exposed to light via the photomask 507.

Figure 12A:
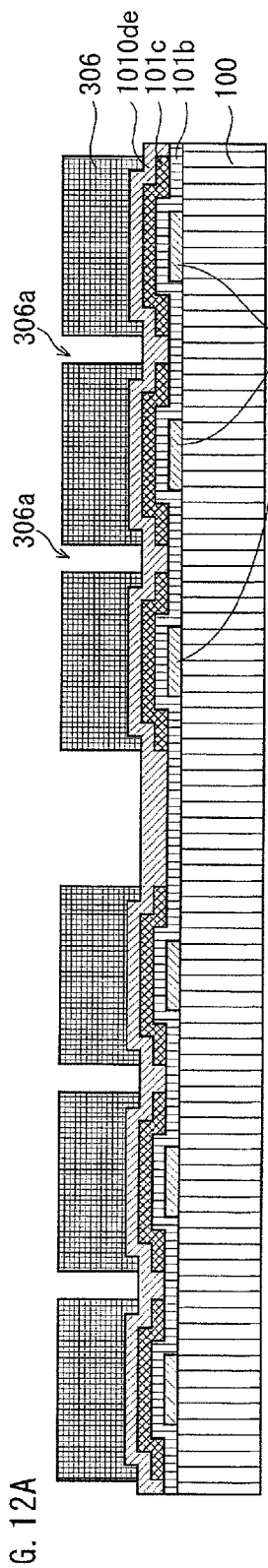
FIGS. 12A to 12C are schematic cross-sectional views illustrating a part of the manufacturing step of the organic EL apparatus 1.

Following this, as shown in FIG. 12A, the resist film 305 having gone through the exposure step is developed. This development removes portions, which have been exposed to light, to generate openings 306a, and a resist film 306 with the openings is obtained.

Figure 12B:
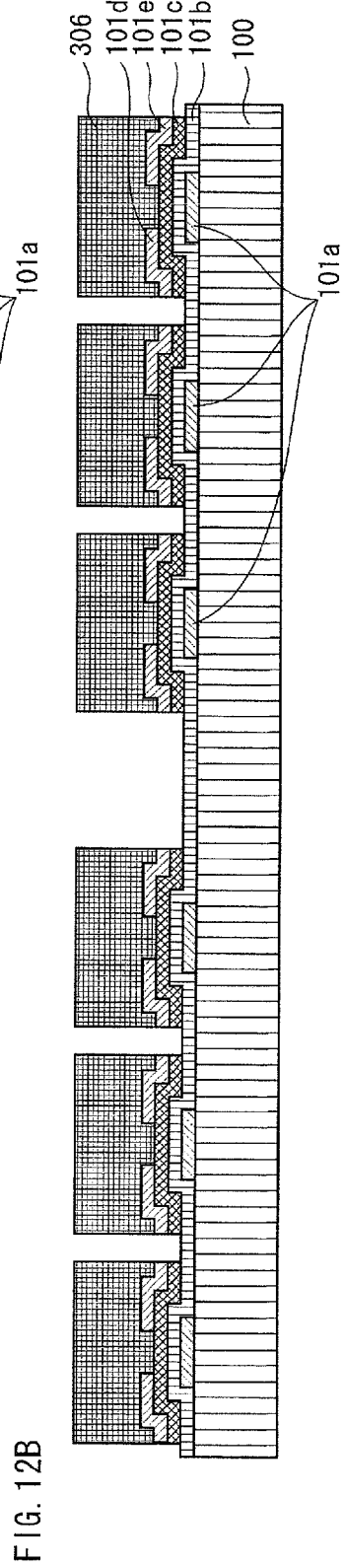

Next, as shown in FIG. 12B, the metal film 1010de is etched to obtain a source electrode 101d and a drain electrode 101e of the TFT layer 101 (step S5 in FIG. 1). Note that the etching performed in the present step may be dry etching or wet etching.

(2) Formation of Inter-Layer Insulation Film 102 and Planarization Film 103

Figure 12C:
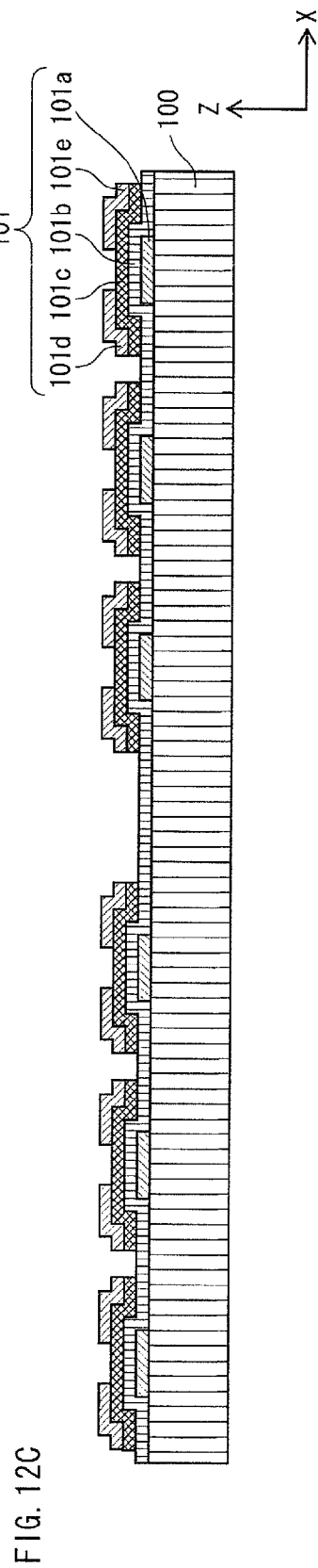
Figure 13A:
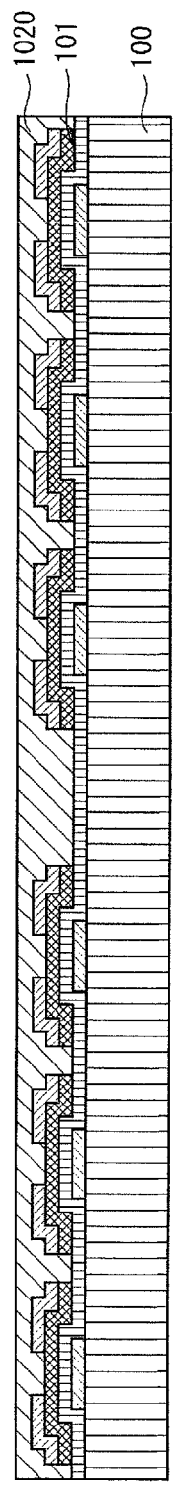
FIGS. 13A and 13B are schematic cross-sectional views illustrating a part of the manufacturing step of the organic EL apparatus 1.

Next, after the resist film 306 is removed as shown in FIG. 12C, an inter-layer insulation film 1020 is formed to cover the TFT layer 101 as shown in FIG. 13A (step S6 in FIG. 1). The CVD method may be used to form the inter-layer insulation film 1020. The material of the inter-layer insulation film 1020 may be, for example, silicon nitride ($SiN_x$), silicon oxide ($SiO_x$) or the like.

Figure 13B:
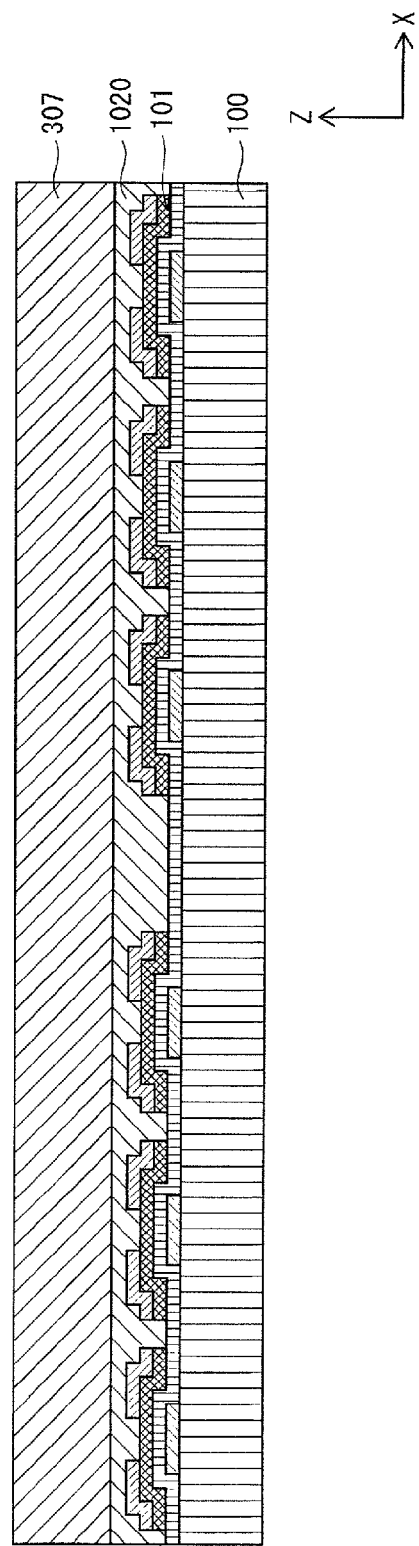

Subsequently, as shown in FIG. 13B, a positive-type resist film 307 is deposited to cover the inter-layer insulation film 1020.

Following this, as shown in FIG. 14A, a photomask 508 is arranged to cover a part of the upper surface of the resist film 307 deposited on the inter-layer insulation film 1020. With regard to the photomask 508 too, light-shielding regions 508b are formed on a main surface of a light-transmissive substrate 508a facing downward in the Z axis direction so that a pattern is formed. An exposure is performed in this state, so that a part 307a of the resist film 307 is exposed to light via the photomask 508.

Subsequently, as shown in FIG. 14B, a photomask 509 is arranged to cover another part of the upper surface of the resist film 307. With regard to the photomask 509 too, light-shielding regions 509b are formed on a main surface of a light-transmissive substrate 509a facing downward in the Z axis direction so that a pattern is formed. The photomask 509 is arranged such that an end thereof overlaps with an end of the photomask 508 used in the previous exposure (an overlap region $OR_5$).

An exposure is performed in the state shown in FIG. 14B, so that a part 307b of the resist film 307 is exposed to light via the photomask 509.

Figure 15A:
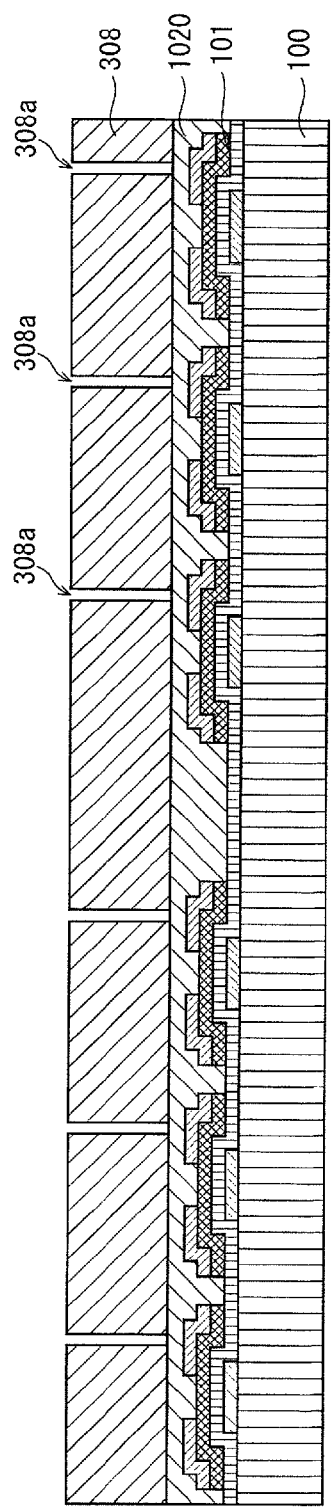
FIGS. 15A and 15B are schematic cross-sectional views illustrating a part of the manufacturing step of the organic EL apparatus 1.

Following this, as shown in FIG. 15A, the resist film 307 having gone through the exposure step is developed. This development removes portions 307a and 307b, which have been exposed to light, to generate openings 308a, and a resist film 308 with the openings 308a is obtained.

Figure 15B:
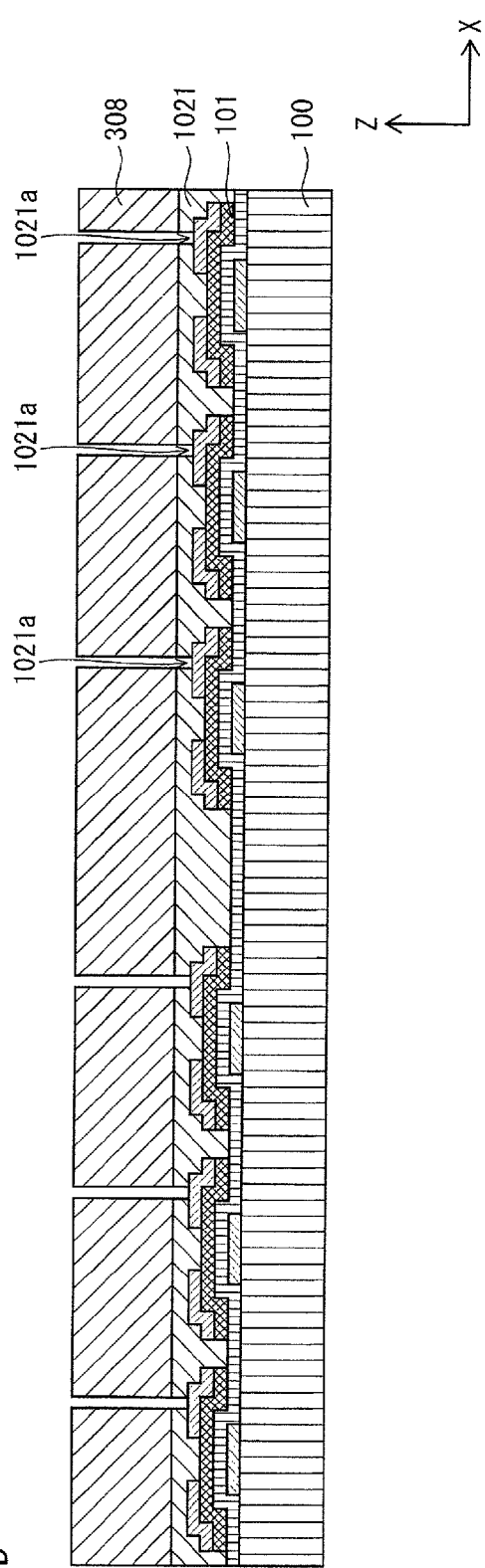

Next, as shown in FIG. 15B, the inter-layer insulation film 1020 is etched by the dry etching via the openings 308a of the resist film 308, and an inter-layer insulation film 1021 with openings (contact holes) 1021a is obtained (step S7 in FIG. 1).

Figure 16A:
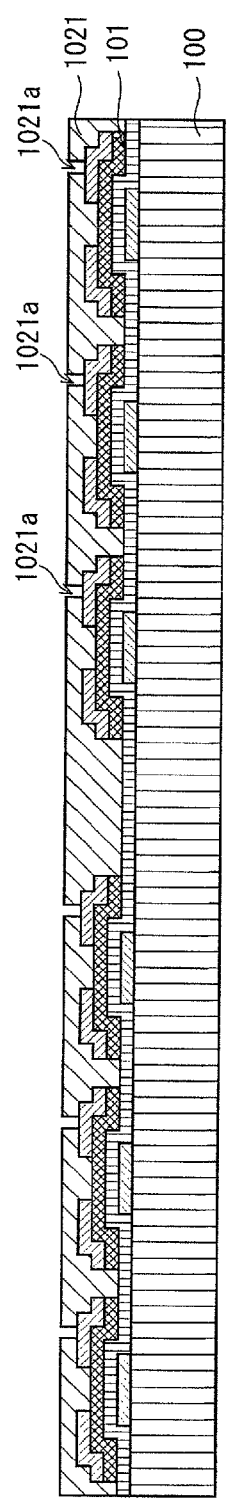
FIGS. 16A and 16B are schematic cross-sectional views illustrating a part of the manufacturing step of the organic EL apparatus 1.
Figure 16B:
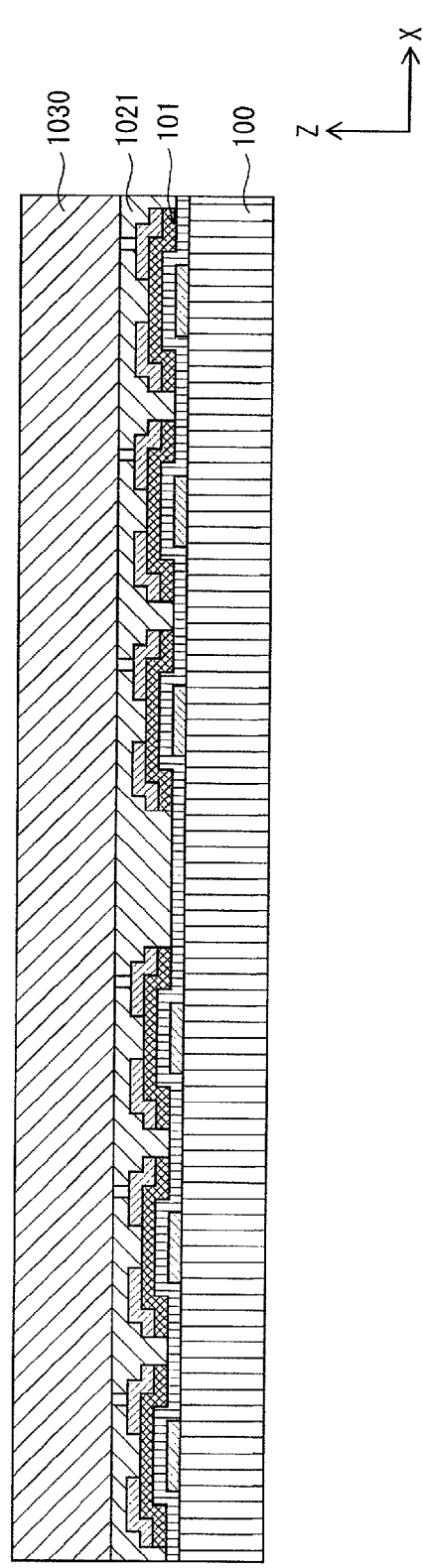

Next, after the resist film 308 is removed as shown in FIG. 16A, a planarization film 1030 is formed to cover the inter-layer insulation film 1021 as shown in FIG. 16B (step S8 in FIG. 1). The planarization film 1030 may be formed by using an organic compound such as polyimide, polyamide, acrylic resin or the like.

Subsequently, as shown in FIG. 17A, a photomask 510 is arranged to cover a part of the upper surface of the planarization film 1030. With regard to the photomask 510 too, light-shielding regions 510b are formed on a main surface of a light-transmissive substrate 510a facing downward in the Z axis direction so that a pattern is formed. An exposure is performed in this state, so that a part 1030a of the planarization film 1030 is exposed to light via the photomask 510.

Subsequently, as shown in FIG. 17B, a photomask 511 is arranged to cover another part of the upper surface of the planarization film 1030. With regard to the photomask 511 too, light-shielding regions 511b are formed on a main surface of a light-transmissive substrate 511a facing downward in the Z axis direction so that a pattern is formed. The photomask 511 is arranged such that an end thereof overlaps with an end of the photomask 510 used in the previous exposure (an overlap region $OR_6$).

An exposure is performed in the state shown in FIG. 17B, so that a part 1030b of the planarization film 1030 is exposed to light via the photomask 511.

Figure 18A:
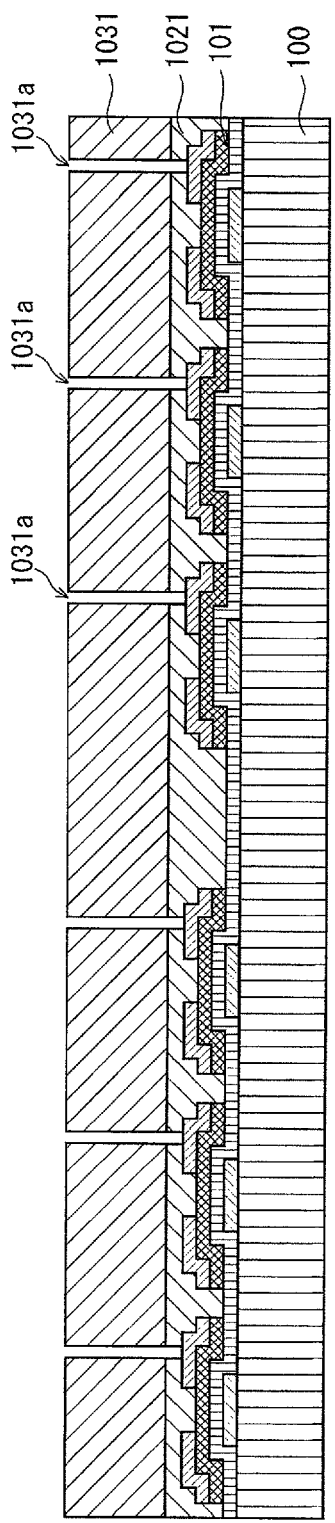
FIGS. 18A and 18B are schematic cross-sectional views illustrating a part of the manufacturing step of the organic EL apparatus 1.

Following this, as shown in FIG. 18A, the planarization film 1030 having gone through the exposure step is developed. With this development, a planarization film 1031 with openings (contact holes) 1031a, which communicate with the openings (contact holes) 1021a of the inter-layer insulation film 1021 (see FIG. 16A), is obtained (step S9 in FIG. 1).

Figure 18B:
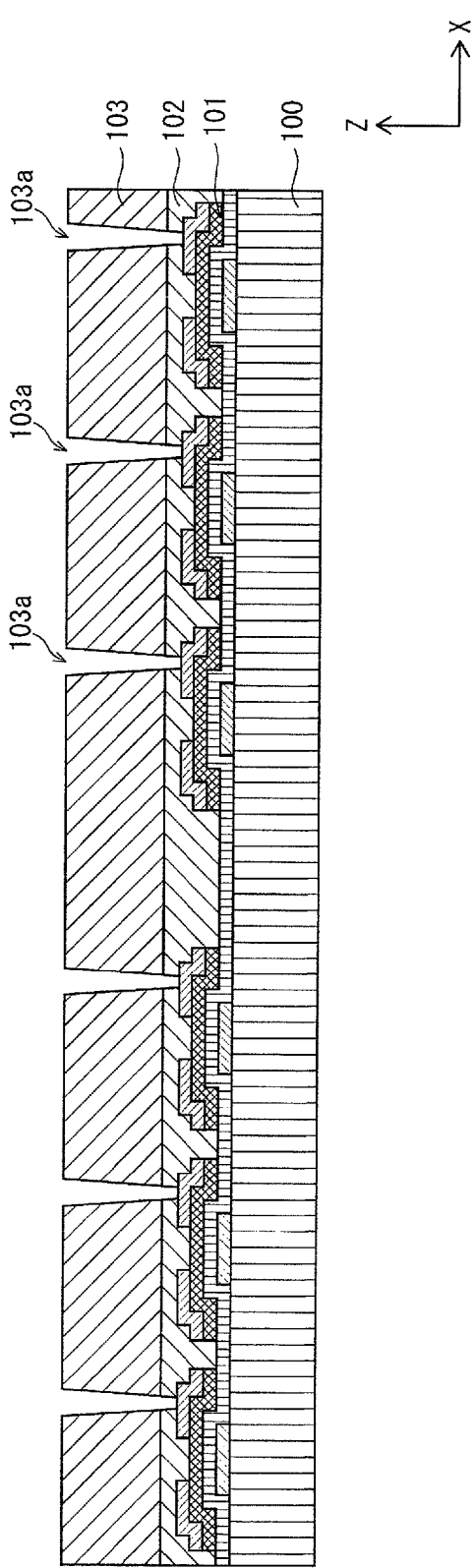

Next, the planarization film 1031 is baked to obtain a planarization film 103 with openings 103a, each of which gradually increases in cross-sectional size with transition from below to above in the Z axis direction, as shown in FIG. 18B.

(3) Formation of Anode 104 and Bus Bars 109

Next, a metal film 1040 is formed on a surface of the planarization film 103 to cover the surface including circumferential surfaces defining respective openings 103a. The metal film 1040 may be formed by, for example, the sputtering method, and the material of the metal film 1040 may be, for example, a material including silver (Ag) or aluminum (Al) or the like.

Subsequently, a positive-type resist film 309 is deposited to cover the metal film 1040.

Subsequently, as shown in FIG. 20A, a photomask 512 is arranged to cover a part of the upper surface of the resist film 309. With regard to the photomask 512 too, light-shielding regions 512b are formed on a main surface of a light-transmissive substrate 512a facing downward in the Z axis direction so that a pattern is formed. An exposure is performed in this state, so that a part 309a of the resist film 309 is exposed to light via the photomask 512.

Subsequently, as shown in FIG. 20B, a photomask 513 is arranged to cover another part of the upper surface of the resist film 309. With regard to the photomask 513 too, light-shielding regions 513b are formed on a main surface of a light-transmissive substrate 513a facing downward in the Z axis direction so that a pattern is formed. The photomask 513 is arranged such that an end thereof overlaps with an end of the photomask 512 used in the previous exposure (an overlap region $OR_7$).

An exposure is performed in the state shown in FIG. 20B, so that a part 309b of the resist film 309 is exposed to light via the photomask 513.

Following this, as shown in FIG. 21A, the resist film 309 having gone through the exposure step is developed. This development removes portions 309a and 309b, which have been exposed to light, to generate openings 310a, and a resist film 310 with the openings 310a is obtained. Subsequently, as shown in FIG. 21B, a metal film 1040 is etched to remove its portions exposed to the air as the bottoms of the openings 310a, which results in the formation of pixel electrodes (anodes) 104 and electric wires (bus bars) 109 that are arranged at intervals (step S10 in FIG. 1). Note that the etching performed to form the anodes 104 and bus bars 109 may be dry etching or wet etching.

(4) Formation of Bank 105

Figure 22A:
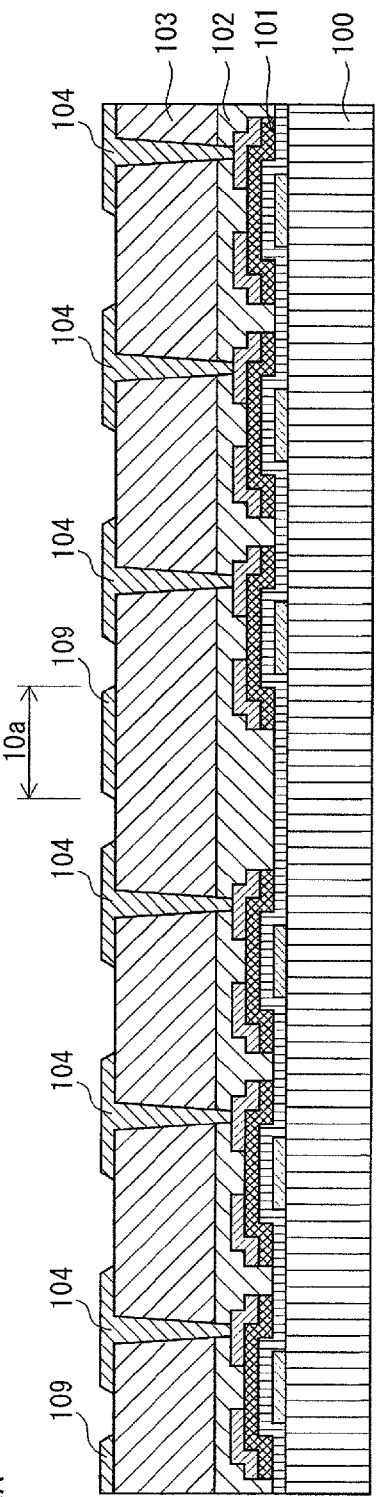
FIGS. 22A and 22B are schematic cross-sectional views illustrating a part of the manufacturing step of the organic EL apparatus 1.
Figure 22B:
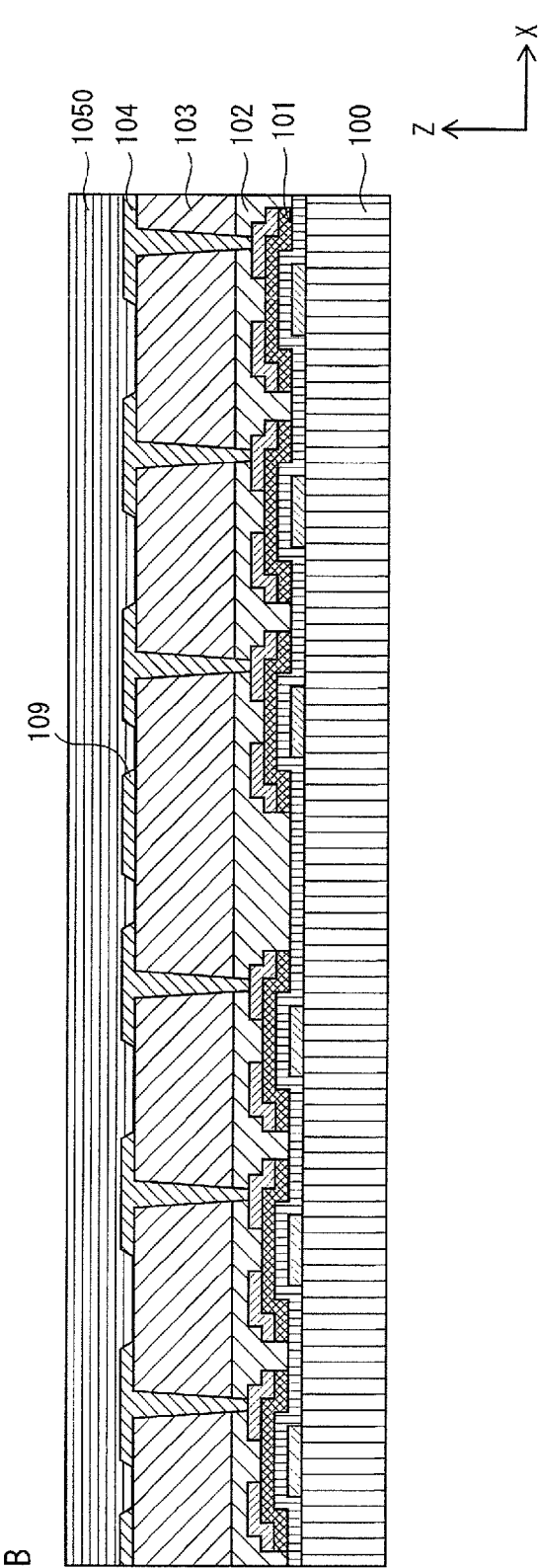

Next, after the resist film 310 is removed as shown in FIG. 22A, a bank material film 1050 is deposited as shown in FIG. 22B. The material of the bank material film 1050 may be an organic material such as resin, may have insulating properties, and may be, for example, acrylic resin, polyimide resin, novolac-type phenolic resin or the like. Also, the organic material used for the bank material film 1050 may have organic solvent resistance. Furthermore, since the bank material film 1050 may undergo an etching process, a baking process or the like during the bank formation step, the bank material film 1050 may be formed from highly resistant material that will not change excessively in shape or quality during such processes.

Note that the bank material film 1050 does not need to have a single-layered structure as shown in FIG. 22B, but may have a multi-layered structure composed of two or more layers. In such a case, the above materials may be combined for each layer, or inorganic material(s) and/or organic material(s) may be used for each layer.

As shown in FIG. 22A, none of the electrodes 101*a*, 101*d*, 101*e* of the TFT layer 101 or the like is formed below the bus bars 109 (bus-bar-formation regions 10*a*) in the Z axis direction.

Subsequently, as shown in FIG. 23A, a photomask 514 is arranged to cover a part of the upper surface of the bank material film 1050. With regard to the photomask 514 too, light-shielding regions 514*b* are formed on a main surface of a light-transmissive substrate 514*a* facing downward in the Z axis direction so that a pattern is formed. As shown in FIG. 23A, the light-shielding regions 514*b* of the photomask 514 are set to such regions that positionally correspond to the anodes 104 and the bus bars 109.

An exposure is performed in the state shown in FIG. 23A, so that a part 1050*a* of the bank material film 1050 is exposed to light via the photomask 514.

Subsequently, as shown in FIG. 23B, a photomask 515 is arranged to cover another part of the upper surface of the bank material film 1050. With regard to the photomask 515 too, light-shielding regions 515*b* are formed on a main surface of a light-transmissive substrate 515*a* facing downward in the Z axis direction so that a pattern is formed. The photomask 515 is arranged such that an end thereof overlaps with an end of the photomask 514 used in the previous exposure (an overlap region $OR_8$). Note that the light-shielding regions 515*b* of the photomask 515 are also set to regions that positionally correspond to the anodes 104 and the bus bars 109.

An exposure is performed in the state shown in FIG. 23B, so that a part 1050*b* of the bank material film 1050 is exposed to light via the photomask 515.

Figure 24A:
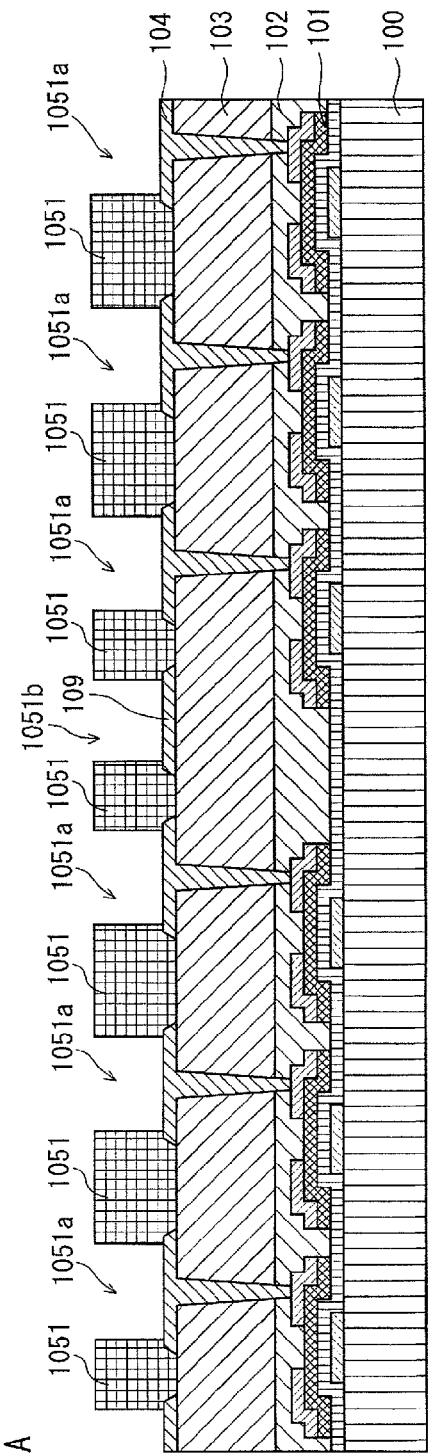
FIGS. 24A and 24B are schematic cross-sectional views illustrating a part of the manufacturing step of the organic EL apparatus 1.

Following this, as shown in FIG. 24A, the bank material film 1050 having gone through the exposure step is developed. This development removes portions 1050*a* and 1050*b*, which have been exposed to light, to generate openings 1051*a* and 1051*b*, and a bank material film 1051 with the openings 1051*a* and 1051*b* is obtained. The anodes 104 and the bus bars 109 are exposed to the air as the bottoms of the openings 1051*a* of the bank material film 1051.

Figure 24B:
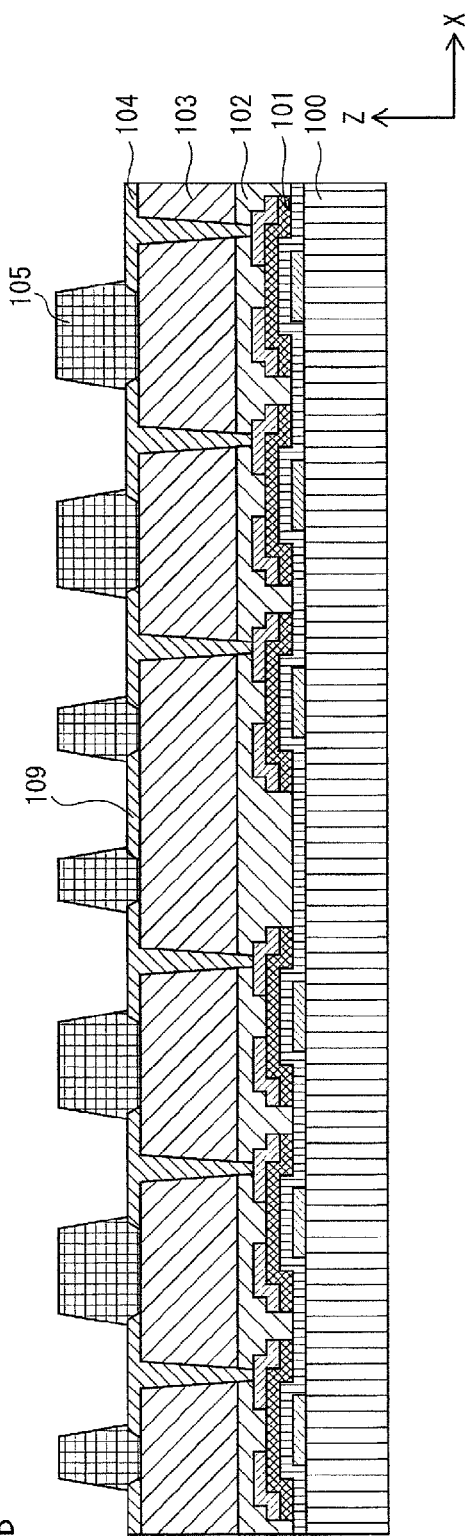

Next, the bank material film 1051 is baked as shown in FIG. 24B to form a bank 105 (step S11 in FIG. 1). Note that, after this, the surface of the bank 105, more specifically the inner side surfaces of the bank 105 facing each opening, may be processed to have liquid-repellent property. For example, the surfaces may be fluoridated.

(5) Formation of Functional Layer 106

Next, a functional layer 106 is formed to cover the anodes 104 exposed to the air as the bottoms of some of the openings defined by the bank 105 (step S12 in FIG. 1). The functional layer 106 has a laminated structure including at least an organic light-emitting layer. Also in the laminated structure, for example, a hole injection layer and a hole transport layer are inserted between an anode 104 and the organic light-emitting layer, and above the organic light-emitting layer in the Z axis direction, an electron transport layer and the like are formed.

The material of the hole injection layer may be, for example, an electroconductive polymer such as PEDOT (a mixture of polythiophene and polystyrene sulfonate), or a transition metal oxide such as molybdenum (Mo) oxide or tungsten (W) oxide.

Also, the material of the hole transport layer may be a polymer not containing a hydrophilic group. For example, a polymer (e.g., polyfluorene, a derivative of polyfluorene, polyarylamine, or a derivative of polyarylamine) that does not contain a hydrophilic group may be used.

The organic light-emitting layer may be formed by using, for example, a wet process. The material of the organic light-emitting layer may be a light-emitting organic material that can be formed into a film by using the wet process.

More specifically, the organic light-emitting layer 116 may be formed, for example, from a fluorescent material recited in Japanese Patent Application Publication No. H5-163488, such as an oxinoid compound, perylene compound, coumarin compound, azacoumarin compound, oxazole compound, oxadiazole compound, perinone compound, pyrrolo-pyrrole compound, naphthalene compound, anthracene compound, fluorene compound, fluoranthene compound, tetracene compound, pyrene compound, coronene compound, quinolone compound and azaquinolone compound, pyrazoline derivative and pyrazolone derivative, rhodamine compound, chrysene compound, phenanthrene compound, cyclopentadiene compound, stilbene compound, diphenylquinone compound, styryl compound, butadiene compound, dicyanomethylene pyran compound, dicyanomethylene thiopyran compound, fluorescein compound, pyrylium compound, thiapyrylium compound, selenapyrylium compound, telluropyrylium compound, aromatic aldadiene compound, oligophenylene compound, thioxanthene compound, anthracene compound, cyanine compound, acridine compound, metal complex of an 8-hydroxyquinoline compound, metal complex of a 2-bipyridine compound, complex of a Schiff base and a group three metal, metal complex of oxine, rare earth metal complex, etc.

Examples of the material used to form the electron transport layer include an oxadiazole derivative, benzoquinone or a derivative thereof, anthraquinone or a derivative thereof, a metal complex of a 8-hydroxyquinoline compound or a derivative thereof, polyquinoline or a derivative thereof, polyquinoxaline or a derivative thereof, or polyfluorene or a derivative thereof.

Next, as shown in FIG. 25, a common electrode (cathode) 107 is formed to cover the exposed surfaces of the functional layer 106 and the bank 105 (step S13 in FIG. 1). The cathode 107 may be made of, for example, ITO, indium zinc oxide (IZO) or the like. In the present exemplary embodiment in which a top-emission-type panel is adopted as one example, the light transmissivity of the cathode 107 may be 80% or greater.

Note that the cathode 107 is electrically connected to the bus bars 109 in the bus-bar-formation regions 10*a*.

Next, a passivation layer 108 is formed to cover the cathode 107 (step S14 in FIG. 1). The passivation layer 108 has a function to restrict particularly the organic light-emitting layer, among the layers constituting the functional layer 106, from being exposed to water or air. The material of the passivation layer 108 may be, for example, silicon nitride (SiN), silicon oxynitride (SiON) or the like. In the present exemplary embodiment in which a top-emission-type panel is adopted as one example, the passivation layer 108 may be made of a light-transmissive material.

After this, the organic EL panel 10 is completed by arranging a color filter (CF) substrate, which is not illustrated and in which a color filter layer is formed, to face the panel described above and connecting the CF substrate with the panel.

2. Manufacturing Method of Organic EL Apparatus 1

As shown in FIG. 26, an organic EL apparatus 1 in the present exemplary embodiment is manufactured by connecting a driving control unit 20 to the organic EL panel 10 manufactured as above, wherein the driving control unit 20 is composed of driving circuits 21 to 24, a control circuit 25 and the like.

Note that an aging process may be performed as appropriate after the driving control unit 20 is connected to the organic EL panel 10.

3. Advantageous Effects

The following explains advantageous effects produced by the manufacturing method of the organic EL panel 10 in the present exemplary embodiment, with reference to FIGS. 27 through 29.

FIG. 27A is a schematic illustration of the structure of a panel that has been formed up to the passivation layer 108, and FIGS. 27B and 27C are schematic cross-sectional views illustrating the exposure of the resist film 300 in the formation of the TFT layer 101.

As shown in FIGS. 27B and 27C, the photomask 501 is arranged such that an end thereof overlaps with an end of the photomask 500 (an overlap region $OR_1$). As apparent from comparison with FIG. 27A, the overlap region $OR_1$ is within a range defined by a bus-bar-formation region 10a in which a bus bar 109 is formed. In other words, in the manufacturing method of the present exemplary embodiment, the photomasks 500 and 501 are arranged such that the overlap region $OR_1$ is selectively included within a range defined by a bus-bar-formation region 10a which is a non-light-emitting region, and is outside the ranges of regions in which the anodes 104 of sub-pixels are formed.

Note that, in the other exposure steps too, the photomasks 502 through 515 are arranged such that the overlap regions $OR_2$ through $OR_8$ are included within the ranges defined by the bus-bar-formation regions 10a.

The manufacturing method of the organic EL panel 10 in the present exemplary embodiment provides a high display quality by adopting the arrangement form of the photomasks 500 through 515 as described above. That is to say, with the above structure in which the overlap regions $OR_2$ through $OR_8$ between the photomasks 500 through 515 are arranged within the ranges defined by the bus-bar-formation regions 10a in which the bus bars 109, that are electrical wires, are formed, the display quality can be maintained even if the portions of the panel corresponding to the overlap regions are affected by the exposures.

Accordingly, the manufacturing method of the organic EL panel 10 in the present exemplary embodiment provides displays with high quality even when the divisional exposure method is adopted in the manufacturing process.

Figure 28A:
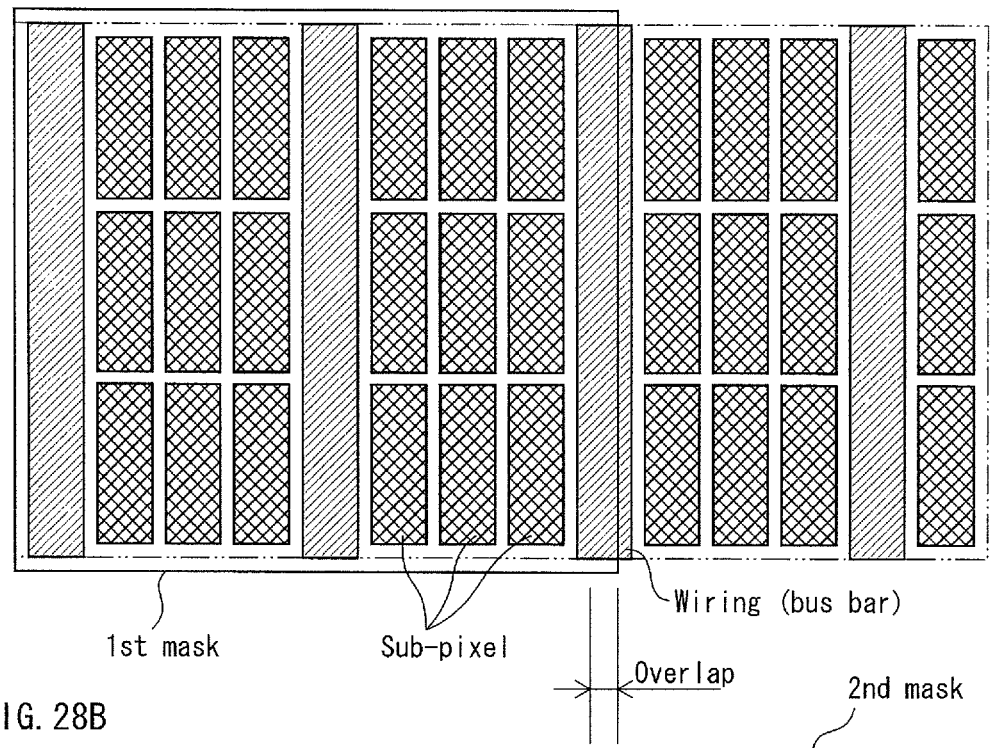
FIG. 28A is a schematic plan view illustrating an arrangement form of the first mask in the first exposure step.
Figure 28B:
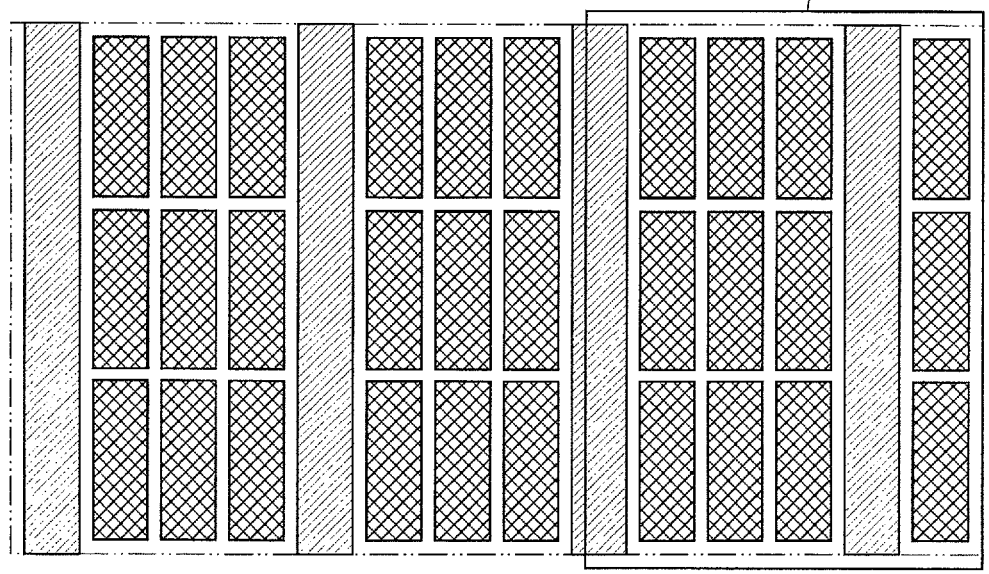
FIG. 28B is a schematic plan view illustrating an arrangement form of the second mask in the second exposure step.

Here, an explanation is given of the arrangement in the present exemplary embodiment with reference to plan views. As shown in FIGS. 28A and 28B, the overlap between the first (photo) mask and the second (photo) mask is set to be included within a range defined by a bus bar that extends like a straight line, which makes it possible to cause the overlap between the masks to be included within a range defined by a bus-bar-formation region. With this structure, even if two exposures are performed onto a bus bar to which the overlap between the masks is assigned, the variation in shape is small since the bus bar has a constant reflection rate. Therefore, the organic EL panel 10 can provide displays with high quality.

Figure 29A:
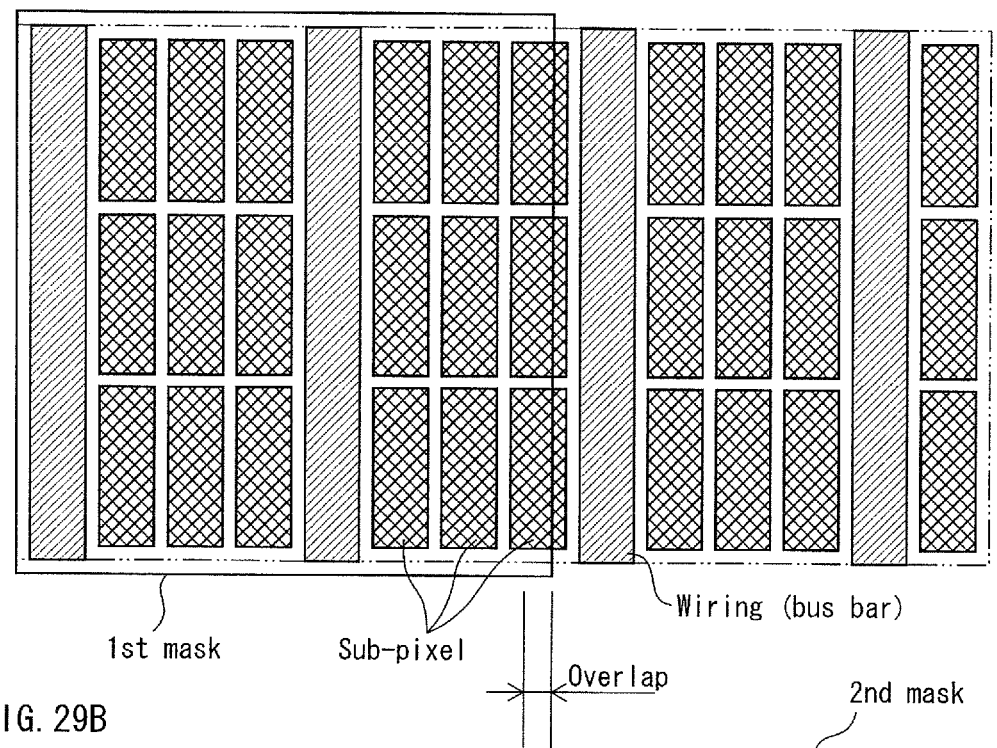
FIG. 29A is a schematic plan view illustrating an arrangement form of the first mask in the first exposure step of a comparative example.
Figure 29B:
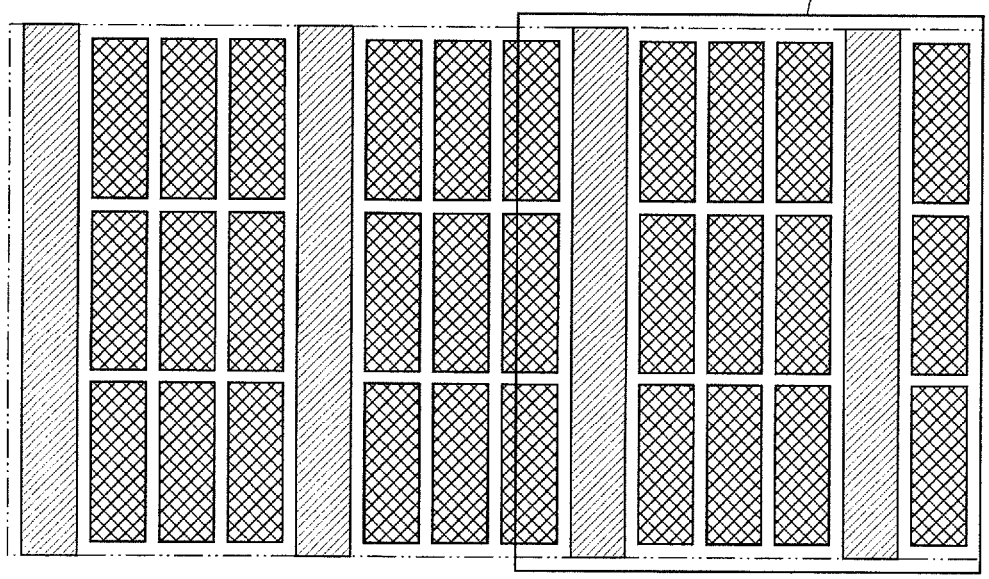
FIG. 29B is a schematic plan view illustrating an arrangement form of the second mask in the second exposure step of the comparative example.

On the other hand, in a manufacturing method of a comparative example shown in FIGS. 29A and 29B, the overlap between the first (photo) mask and the second (photo) mask is set within a range defined by sub-pixel formation regions. In this case, a portion of the panel corresponding to the overlap is a portion including sub-pixels that directly influence the light-emission, and this portion may be affected by the two exposures and change in shape or film quality. Accordingly, a degradation in display quality may occur when the manufacturing method of the comparative example shown in FIGS. 29A and 29B is used.

As described above, the manufacturing method of the organic EL panel 10 in the present exemplary embodiment, due to the structure where the overlap regions $OR_2$ through $OR_8$ between the photomasks 500 through 515 are set to be within the ranges defined by the bus-bar-formation regions 10a, makes it possible to manufacture the organic EL panel 10 that has a high display quality even when the divisional exposure method is adopted for an efficient manufacturing.

4. Configuration of Photomask

Figure 30A:
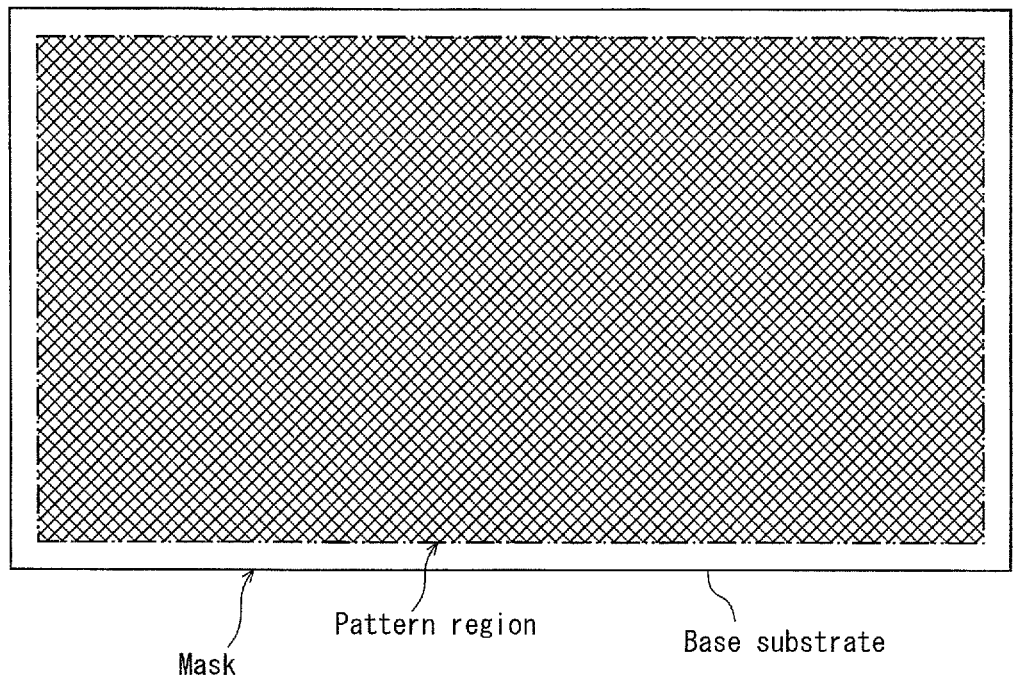
FIG. 30A is a schematic plan view illustrating the structure of a mask used in the exposure step.
Figure 30B:
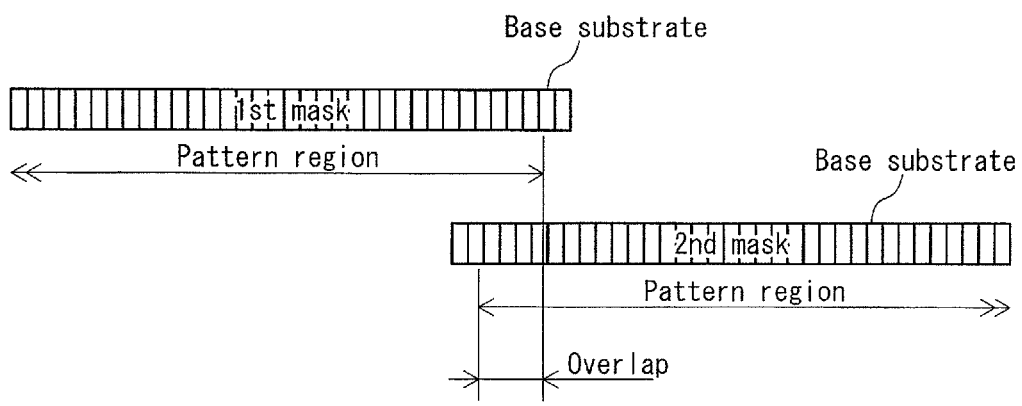
FIG. 30B is a schematic cross-sectional view illustrating an overlap between a first mask and a second mask.

A supplemental note is provided with regard to the configuration of the photomask, with reference to FIGS. 30A and 30B.

As shown in FIG. 30A, the photomask is configured such that a pattern region is formed to occupy a middle area, excluding an outer edge area, of a light-transmissive substrate (base substrate). The light-shielding regions 500b through 515b included in the photomasks 500 through 515 are formed in the pattern region, and are not formed outside the pattern region.

Accordingly, as shown in FIG. 30B, strictly speaking, each of the overlap regions $OR_2$ through $OR_8$ between the first (photo) mask and the second photo (mask) indicated in the present Description does not represent an overlap between ends of the base substrates, but an overlap between ends of the pattern regions.

5. Sign of Exposure Overlap in Divisional Exposures

Figures 31A, 31B:
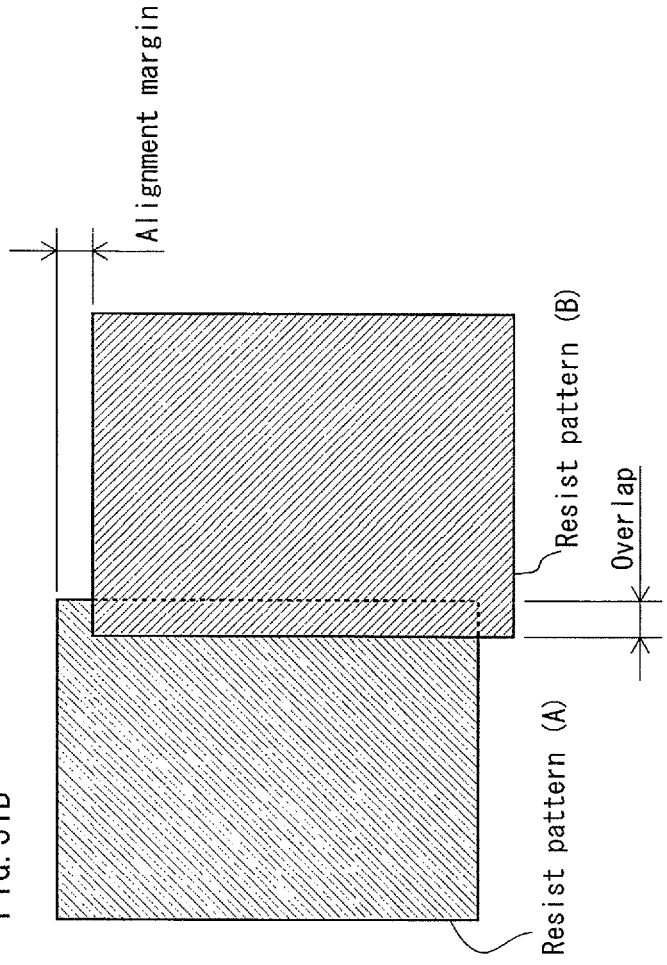
FIG. 31A is a schematic plan view illustrating a resist pattern after the first exposure is performed.
FIG. 31B is a schematic plan view illustrating a resist pattern after the second exposure and the development are performed.
Figures 32A, 32B:
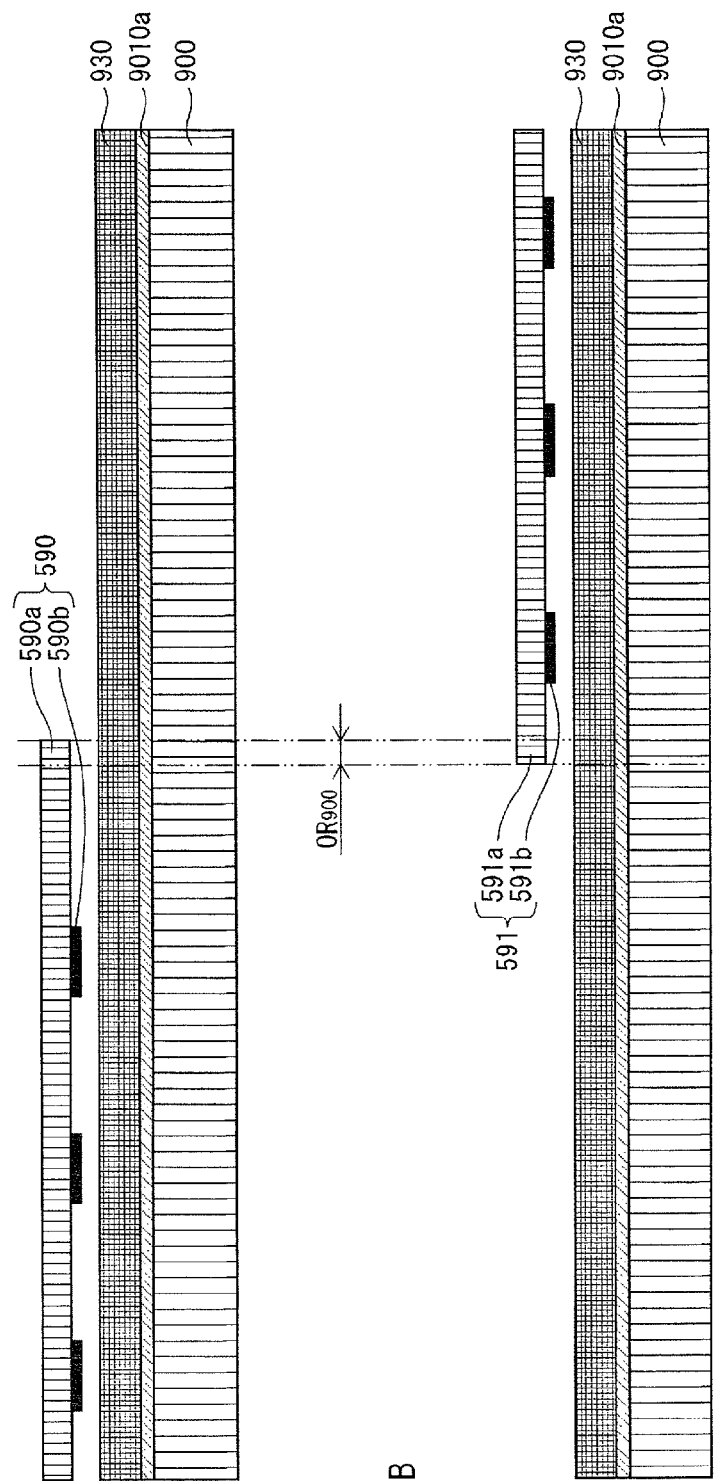
FIG. 32A is a schematic cross-sectional view illustrating the first exposure step of a conventional technology; and FIG.

The following explains the sign of the overlap in the divisional exposures with reference to FIGS. 31A and 31B.

As shown in FIG. 31A, a resist pattern (A) is formed after the first exposure is performed via a photomask. Furthermore, a resist pattern (B) is formed after the second exposure is performed by arranging another photomask such that an end thereof overlaps with an end of the previously used photomask as shown in FIG. 31B, wherein the resist pattern (B) is shifted from the resist pattern (A) by an alignment margin and an end of the resist pattern (B) overlaps with an end of the resist pattern (A).

It is considered that, when a structural element of a device is formed through such exposures, a portion of the device corresponding to an exposure overlap may change or be deformed in shape, film thickness, level or the like. For this reason, it is considered that in the organic EL panel 10 manufactured by the manufacturing method of the present exemplary embodiment, signs of such pattern shifts or changes in film thickness may remain in the bus-bar-formation regions 10a in which the bus bars 109 are formed.

Note that when the value of $3\sigma$, which denotes the alignment accuracy in the exposure apparatus, is presumed to be ±1.5 μm, the width of the overlap between photomasks may be set to 3.0 μm, for example.

[Other Considerations]

In the above manufacturing method of the organic EL panel 10 in the present exemplary embodiment, the overlap regions $OR_2$ through $OR_8$ between ends of the photomasks 500 through 515 are set to be within the ranges defined by the bus-bar-formation regions 10a during all the exposure steps. However, not limited to this, the overlap is not necessarily be set within a range defined by a bus-bar-formation region 10a during a formation of a portion which is recognized empirically not to affect greatly the property of the device (namely the display quality).

In the above manufacturing method of the organic EL panel 10 in the present exemplary embodiment, the overlap regions OR$_2$ through OR$_8$ between ends of the photomasks 500 through 515 are set to be within the ranges defined by the bus-bar-formation regions 10*a* in all of the exposure steps. However, not limited to this, the regions by which the ranges for including the overlap regions OR$_2$ through OR$_8$ are defined are not necessarily be the bus-bar-formation regions 10*a*. For example, if there is a region in which a gap between adjacent sub-pixels is wider than any other gap between adjacent sub-pixels in the other regions, the overlap between photomasks may be set to be within a range defined by the region having the wider gap between adjacent sub-pixels. This structure can also prevent the influence of two exposures from affecting the display quality.

Furthermore, in the above exemplary embodiment, after the first exposure is performed, the second exposure is performed. However, not limited to this, the step may be performed such that the first exposure and the second exposure overlap in time partially.

Furthermore, in the above exemplary embodiment, each exposure step is divided into two exposures and two divisional exposures are performed. However, not limited to this, each exposure step may be divided into three or more exposures and three or more divisional exposures may be performed. In that case too, the exposure overlap may be set to be within a range defined by a bus-bar-formed region 10*a* or by a region in which a gap between adjacent sub-pixels is wider than any other gap between adjacent sub-pixels in the other regions to obtain an effect similar to the above effect.

Furthermore, in the above exemplary embodiment, a manufacture of the organic EL panel 10 for the organic EL apparatus 1 is explained as one example. However, the present disclosure may be applied to manufactures of other devices to obtain effects that are similar to the above effect. As the devices other than the organic EL panel, for example, display panels such as a liquid-crystal display panel and a plasma display panel, and other panel-like devices may be applicable.

Furthermore, other than the display panels, the present disclosure is applicable to, for example, an imaging apparatus provided with a photoelectric conversion film, a solar battery apparatus using an organic semiconductor or the like.

INDUSTRIAL APPLICABILITY

The present disclosure provides a highly efficient manufacturing method adopting the divisional exposure method, and is useful in realizing a high-quality device while restricting degradation of its original properties.

REFERENCE SIGNS LIST 1. organic EL apparatus
10. organic EL panel
10*a*. bus bar region
20. driving control unit
21-24. driving circuit
25. control circuit
100. substrate
101. TFT layer
101*a*. gate electrode
101*b*. gate insulation film
101*c*. semiconductor layer
101*d*. source electrode
101*e*. drain electrode
102. inter-layer insulation film
103. planarization film
104. anode
105. bank
106. functional layer
107. cathode
108. passivation layer
109. bus bar
300, 301, 302, 303, 304, 305, 306, 307, 308, 309, 310 resist film
500, 501, 502, 503, 504, 505, 506, 507, 508, 509, 510, 511, 512, 513, 514, 515. photomask
500*a*, 501*a*, 502*a*, 503*a*, 504*a*, 505*a*, 506*a*, 507*a*, 508*a*, 509*a*, 510*a*, 511*a*, 512*a*, 513*a*, 514*a*, 515*a*. light-transmissive substrate
500*b*, 501*b*, 502*b*, 503*b*, 504*b*, 505*b*, 506*b*, 507*b*, 508*b*, 509*b*, 510*b*, 511*b*, 512*b*, 513*b*, 514*b*, 515*b*. light-shielding region
1010*a*, 1010*de*, 1040. metal film
1010*b*. insulation film
1010*c*. semiconductor film
1020, 1021. inter-layer insulation film
1030, 1031. planarization film
1050, 1051. bank material film

The invention claimed is:

1. A device manufacturing method, comprising:
preparing a substrate;
forming, on the substrate, a plurality of pixel electrodes arranged at intervals and forming one or more electrical wires each between adjacent pixel electrodes among the plurality of pixel electrodes;
forming a photosensitive film by applying a photosensitive material onto the substrate;
arranging, after forming the photosensitive film, a first photomask to face the substrate and performing a first exposure to cause a first part of the photosensitive film to be exposed to light via the first photomask;
arranging, after or together with an execution of the first exposure, a second photomask to face the substrate and performing a second exposure to cause a second part of the photosensitive film to be exposed to light via the second photomask; and
developing the photosensitive film of which the first part and the second part have been exposed to the light in the first exposure and the second exposure, respectively,
wherein, in the second exposure, the second photomask is specifically arranged such that an end thereof overlaps with an end of the first photomask arranged in the first exposure and a portion thereof is non-overlapping with the first photomask arranged in the first exposure, and
an overlap between the first part and the second part of the photosensitive film is exposed to the first exposure via the first photomask and to the second exposure via the second photomask and positionally corresponds to an electrical wire among the one or more electrical wires, and non-overlapping portions of the first part and the second part of the photosensitive film are each exposed to one of the first exposure and the second exposure via one of the first photomask and the second photomask and positionally correspond to pixel electrodes among the plurality of pixel electrodes.

2. The device manufacturing method of claim 1, wherein each of the one or more electrical wires is formed as a straight line on a surface of the substrate and is larger in width than the overlap between the first part and the second part of the photosensitive film that is exposed to the first exposure and the second exposure.

3. The device manufacturing method of claim 1, wherein the photosensitive film is formed after the plurality of pixel electrodes is formed.

4. The device manufacturing method of claim 1, wherein the plurality of pixel electrodes is formed after the photosensitive film is formed, the first exposure is performed, the second exposure is performed, and the photosensitive film is developed.

5. The device manufacturing method of claim 1, wherein a mask pattern is formed in at least one partial region of each of the first photomask and the second photomask, and the end of the first photomask which overlaps with the end of the second photomask is an overlap between the mask pattern of the first photomask and the mask pattern of the second photomask.

6. The device manufacturing method according to claim 1, wherein the overlap between the first part of the photosensitive film that is exposed to the first exposure via the first photomask and the second part of the photosensitive film that is exposed to the second exposure via the second photomask corresponds to a pattern region of each of the first photomask and the second photomask.

7. A device manufacturing method, comprising:
preparing a substrate;
forming, on the substrate, a plurality of pixel electrodes arranged at intervals;
forming a photosensitive film by applying a photosensitive material onto the substrate;
arranging, after forming the photosensitive film, a first photomask to face the substrate and performing a first exposure to cause a first part of the photosensitive film to be exposed to light via the first photomask;
arranging, after or together with the first exposure, a second photomask to face the substrate and performing a second exposure to cause a second part of the photosensitive film to be exposed to light via the second photomask; and
developing the photosensitive film of which the first part and the second part have been exposed to the light in the first exposure and the second exposure, respectively,
wherein a region in which the plurality of pixel electrodes are formed includes a first pixel electrode formation region and a second pixel electrode formation region, and the plurality of pixel electrodes is formed such that a gap between adjacent pixel electrodes in the second pixel electrode formation region is larger than a gap between adjacent pixel electrodes in the first pixel electrode formation region,
in the second exposure, the second photomask is specifically arranged such that an end thereof overlaps with an end of the first photomask arranged in the first exposure and a portion thereof is non-overlapping with the first photomask arranged in the first exposure, and
an overlap between the first part and the second part of the photosensitive film is exposed to the first exposure via the first photomask and to the second exposure via the second photomask and positionally corresponds to the second pixel electrode formation region, and non-overlapping portions between the first part and the second part of the photosensitive film are each exposed to one of the first exposure and the second exposure via one of the first photomask and the second photomask.

8. The device manufacturing method of claim 7, wherein a metal film is formed as a straight line in the second pixel electrode formation region, and the overlap between the first part of the photosensitive film that is exposed to the first exposure via the first photomask and the second part of the photosensitive film that is exposed to the second exposure via the second photomask positionally corresponds to the metal film.

9. The device manufacturing method of claim 7, wherein the photosensitive film is formed after the plurality of pixel electrodes is formed.

10. The device manufacturing method of claim 7, wherein the plurality of pixel electrodes is formed after the photosensitive film is formed, the first exposure is performed, the second exposure is performed, and the photosensitive film is developed.

11. The device manufacturing method according to claim 7, the second pixel electrode formation region is formed as a straight line on the substrate and is larger in width than the overlap between the first part and the second part of the photosensitive film that is exposed to the first exposure and the second exposure.

12. The device manufacturing method according to claim 7, wherein the overlap between the first part of the photosensitive film that is exposed to the first exposure via the first photomask and the second part of the photosensitive film that is exposed to the second exposure via the second photomask corresponds to a pattern region of each of the first photomask and the second photomask.

13. A device manufacturing method, comprising:
preparing a substrate;
forming, on the substrate, an electrode material film which contains an electrode material;
forming a photosensitive film by applying a photosensitive material onto the electrode material film;
arranging, after forming the photosensitive film, a first photomask to face the substrate and performing a first exposure to cause a first part of the photosensitive film to be exposed to light via the first photomask;
arranging, after or together with the first exposure, a second photomask to face the substrate and performing a second exposure to cause a second part of the photosensitive film to be exposed to light via the second photomask;
developing the photosensitive film of which the first part and the second part have been exposed to the light in the first exposure and the second exposure, respectively; and
forming, on the substrate, a plurality of pixel electrodes arranged at intervals and forming one or more electrical wires each between adjacent pixel electrodes among the plurality of pixel electrodes by etching the electrode material film via the photosensitive film that is developed in the developing,
wherein, in the second exposure, the second photomask is specifically arranged such that an end thereof overlaps with an end of the first photomask arranged in the first exposure and a portion thereof is non-overlapping with the first photomask arranged in the first exposure, and
an overlap between the first part and the second part of the photosensitive film is exposed to the first exposure via the first photomask and to the second exposure via the second photomask and is positioned above a region in which an electrical wire among the one or more electrical wires is to be formed, and non-overlapping portions between the first part and the second part of the photosensitive film are each exposed to one of the first exposure and the second exposure via one of the first photomask and the second photomask and are positioned above regions in which pixel electrodes among the plurality of pixel electrodes are to be formed.

14. The device manufacturing method according to claim 13, the electrical wire is to be formed as a straight line on the substrate and to be larger in width than the overlap between the first part and the second part of the photosensitive film that is exposed to the first exposure and the second exposure.

15. The device manufacturing method according to claim 13, wherein the overlap between the first part of the photosensitive film that is exposed to the first exposure via the first photomask and the second part of the photosensitive film that is exposed to the second exposure via the second photomask corresponds to a pattern region of each of the first photomask and the second photomask.

16. A device manufacturing method, comprising:
preparing a substrate;
forming, on the substrate, an electrode material film which contains an electrode material;
forming a photosensitive film by applying a photosensitive material onto the electrode material film;
arranging, after forming the photosensitive film, a first photomask to face the substrate and performing a first exposure to cause a first part of the photosensitive film to be exposed to light via the first photomask;
arranging, after or together with the first exposure, a second photomask to face the substrate and performing a second exposure to cause a second part of the photosensitive film to be exposed to light via the second photomask;
developing the photosensitive film of which the first part and the second part have been exposed to the light in the first exposure and the second exposure, respectively; and
forming, on the substrate, a plurality of pixel electrodes arranged at intervals by etching the electrode material film via the photosensitive film that is developed in the developing,
wherein a region in which the plurality of pixel electrodes is formed includes a first pixel electrode formation region and a second pixel electrode formation region,
the plurality of pixel electrodes is formed such that a gap between adjacent pixel electrodes in the second pixel electrode formation region is larger than a gap between adjacent pixel electrodes in the first pixel electrode formation region,
in the second exposure, the second photomask is specifically arranged such that an end thereof overlaps with an end of the first photomask arranged in the first exposure and a portion thereof is non-overlapping with the first photomask arranged in the first exposure, and
an overlap between the first part and the second part of the photosensitive film is exposed to the first exposure via the first photomask and to the second exposure via the second photomask and is positioned above the second pixel electrode formation region, and non-overlapping portions between the first part and the second part of the photosensitive film are each exposed to one of the first exposure and the second exposure via one of the first photomask and the second photomask.

17. The device manufacturing method according to claim 16, the second pixel electrode formation region is formed as a straight line on the substrate and is larger in width than the overlap between the first part and the second part of the photosensitive film that is exposed to the first exposure and the second exposure.

* * * * *